United States Patent
Hosono et al.

(10) Patent No.: US 9,865,663 B2
(45) Date of Patent: Jan. 9, 2018

(54) ORGANIC LIGHT-EMITTING DEVICE

(71) Applicant: JOLED INC., Tokyo (JP)

(72) Inventors: Nobuto Hosono, Tokyo (JP); Kenichi Nendai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/963,652

(22) Filed: Dec. 9, 2015

(65) Prior Publication Data

US 2016/0172424 A1 Jun. 16, 2016

(30) Foreign Application Priority Data

Dec. 12, 2014 (JP) .................. 2014-251872

(51) Int. Cl.
 *H01L 27/32* (2006.01)
(52) U.S. Cl.
 CPC .... *H01L 27/3246* (2013.01); *H01L 2251/558* (2013.01)
(58) Field of Classification Search
 CPC ................................. H01L 27/3246
 See application file for complete search history.

(56) References Cited

U.S. PATENT DOCUMENTS

| 8,008,860 B2 | 8/2011 | Yoshida et al. |
| 8,217,573 B2 | 7/2012 | Yoshida et al. |
| 2012/0049175 A1* | 3/2012 | Ono .................. H01L 27/3246 257/40 |
| 2012/0091439 A1* | 4/2012 | Nishiyama .......... H01L 27/3216 257/40 |

FOREIGN PATENT DOCUMENTS

JP 2002-075640 3/2002

* cited by examiner

*Primary Examiner* — Shaun Campbell
*Assistant Examiner* — Aneta Cieslewicz
(74) *Attorney, Agent, or Firm* — Greenblum & Bernstein, P.L.C.

(57) ABSTRACT

An organic light-emitting device including a substrate, first electrodes, first banks extending in a first direction, second banks extending in a second direction, organic functional layers each including an organic light-emitting layer, and a second electrode. The second banks include an organic fluorine compound, and have portions intersecting with and disposed above the first banks. Each of the first banks includes an organic bank layer including an organic material and an inorganic bank layer disposed on the organic bank layer. For each of the first banks, an uppermost surface thereof is a surface of the inorganic bank layer included therein.

17 Claims, 13 Drawing Sheets

ORGANIC LIGHT-EMITTING DEVICE

This application is based on an application No. 2014-251872 filed in Japan, the contents of which are hereby incorporated by reference.

BACKGROUND OF THE DISCLOSURE (1) Technical Field

The present disclosure relates to organic light-emitting devices such as organic electroluminescence (EL) display panels, and in particular to banks for defining sub-pixels.

(2) Description of Related Art

In recent years, organic light-emitting devices such as organic EL display panels are being developed. When manufacturing an organic light-emitting device, a known technique is forming an organic functional layer including an organic light-emitting layer via a printing method (JP 2002-75640). When forming an organic functional layer by a printing method, material of the organic functional layer is applied in an ink state to a region defined by banks, and the organic functional layer is formed by drying the ink. Typically, an organic light-emitting device comprises first banks extending in a row direction and second banks extending in a column direction. The first banks separate sub-pixels of the same light-emission color, and the second banks separate sub-pixels of different light-emission colors. Manufacture of the organic light-emitting device may be performed by, for example, forming a substrate, a first electrode for each sub-pixel, the first banks, the second banks, the organic functional layer, and a second electrode, in this order. When forming the second banks after the first banks, the second banks intersect the first banks and portions of the second banks are positioned above the first banks. As described above, the second banks separate sub-pixels of difference light-emission colors. Further, the second banks have liquid repellency. Thus, when forming the organic functional layer by a printing method, the second banks may be considered to separate ink applied to adjacent sub-pixels.

SUMMARY OF THE DISCLOSURE

The technology pertaining to the present disclosure aims to provide an organic light-emitting device in which defective formation of organic functional layers is prevented.

The organic light-emitting device pertaining to one aspect of the technology of the present disclosure is an organic light-emitting device comprising: a substrate; first electrodes disposed above the substrate at intervals in a first direction and intervals in a second direction, the first direction being parallel to a surface of the substrate and the second direction being parallel to the surface of the substrate and perpendicular to the first direction; first banks disposed above the substrate between adjacent ones of the first electrodes in the second direction, the first banks each extending in the first direction; second banks disposed above the substrate between adjacent ones of the first electrodes in the first direction, the second banks each extending in the second direction, having portions intersecting with and disposed above the first banks, and including an organic fluorine compound; organic functional layers disposed above the first electrodes between the second banks, each of the organic functional layers comprising an organic light-emitting layer; and a second electrode disposed above the organic functional layers, wherein each of the first banks comprises an organic bank layer including an organic material and an inorganic bank layer disposed on the organic bank layer, and for each of the first banks, an uppermost surface thereof is a surface of the inorganic bank layer included therein.

According to the technology pertaining to the present disclosure, an organic light-emitting device in which defective formation of organic functional layers is prevented is provided.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 7A illustrates a partially cut-away perspective view; FIG. 7B illustrates a cross-section of a step of preparing a substrate on which a first bank is formed; and FIG. 7C illustrates a cross-section of a step in which second bank material is applied.

FIG. 8A illustrates a cross-section after forming a second bank; FIG. 8B illustrates a cross-section of a step of applying a hole transport layer material; and FIG. 8C illustrates a cross-section of a step of forming a hole transport layer.

FIG. 9A illustrates a partially cut-away perspective view; FIG. 9B illustrates a cross-section of a step of preparing a substrate on which a first bank is formed; and FIG. 9C illustrates a cross-section of a step in which second bank material is applied.

FIG. 10A illustrates a cross-section after forming a second bank; FIG. 10B illustrates a cross-section of a step of applying a hole transport layer material; and FIG. 10C illustrates a cross-section of a step of forming a hole transport layer.

DESCRIPTION OF EMBODIMENTS

<<Developments of the Present Disclosure>>

Figure 1:
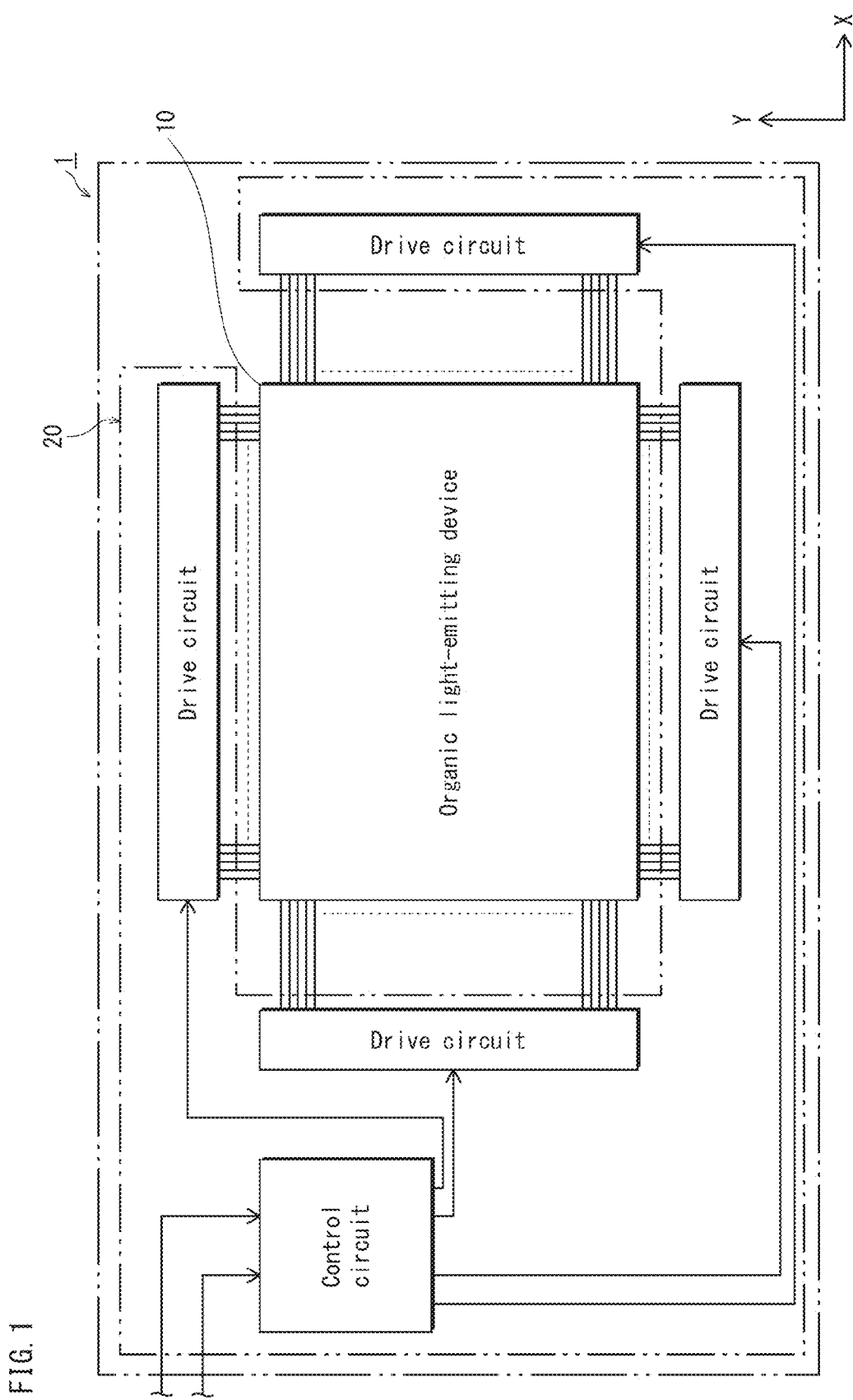
FIG. 1 is a schematic block diagram illustrating a schematic structure of an organic EL display device pertaining to an embodiment of the present disclosure.

In an organic light-emitting device in which organic functional layers are formed above first electrodes, an organic functional layer is formed across all of a region defined by the second banks above the first electrodes (hereafter, "application region"), and all sub-pixels in the application region are caused to emit light. However, when forming the organic functional layer by a printing method, when applying material of the organic functional layer in an ink state across all of the application region, the material of the organic functional layer might not be applied to a portion of the application region. The portion of the application region to which the material of the organic functional layer is not applied is a region near a first bank. In this case, even when the material of the organic functional layer is dried, the organic functional layer is not formed in the region near the first bank. Due to this defective formation of the organic functional layer, light is not emitted in the location in which the organic functional layer is not formed, and is emitted in the location in which the organic functional layer is formed. Thus, uneven light emission occurs within a given set of sub-pixels.

It is understood that this uneven light emission occurs when the second banks are formed by, for example, photolithography, after forming the first banks. Assuming a high affinity between the material of the second banks and the material of the first banks, material of the second banks may remain on surfaces of the first banks. The material of the second banks is an organic fluorine compound, which has liquid repellency. Thus, when material of the second banks remains on surfaces of the first banks, when, for example, the organic functional layer is formed by a printing method, ink may be repelled from the first banks within a region surrounded by the first banks and the second banks. Thus, ink is less likely to spread across an entire region surrounded by the first banks and the second banks.

In contrast, according to the organic light-emitting device pertaining to one aspect of the present disclosure, affinity is low between the organic fluorine compound that is material of the second banks and the inorganic material included in the inorganic bank layers, and therefore material of the second banks is unlikely to remain on surfaces of the first banks. Thus, when forming the organic functional layer by a printing method, ink easily spreads across an entire region surrounded by the first banks and the second banks. Accordingly, occurrence of defective formation of the organic functional layer can be suppressed.

<<Aspects of the Present Disclosure>>

The organic light-emitting device pertaining to one aspect of the present disclosure aims to provide an organic light-emitting device in which defective formation of organic functional layers is prevented.

The organic light-emitting device pertaining to one aspect of the technology of the present disclosure is an organic light-emitting device comprising: a substrate; first electrodes disposed above the substrate at intervals in a first direction and intervals in a second direction, the first direction being parallel to a surface of the substrate and the second direction being parallel to the surface of the substrate and perpendicular to the first direction; first banks disposed above the substrate between adjacent ones of the first electrodes in the second direction, the first banks each extending in the first direction; second banks disposed above the substrate between adjacent ones of the first electrodes in the first direction, the second banks each extending in the second direction, having portions intersecting with and disposed above the first banks, and including an organic fluorine compound; organic functional layers disposed above the first electrodes between the second banks, each of the organic functional layers comprising an organic light-emitting layer; and a second electrode disposed above the organic functional layers, wherein each of the first banks comprises an organic bank layer including an organic material and an inorganic bank layer disposed on the organic bank layer, and for each of the first banks, an uppermost surface thereof is a surface of the inorganic bank layer included therein.

Further, the organic light-emitting device pertaining to the present aspect may be configured to include in the inorganic bank layer an inorganic material selected from the group consisting of silicon nitride, silicon oxide, and silicon oxynitride.

Further, the organic light-emitting device pertaining to the present aspect may be configured so thickness of the inorganic bank layer is from 1 nm to 500 nm.

Further, the organic light-emitting device pertaining to the present aspect may be configured to further comprise an insulating layer disposed between the substrate and the first electrodes, wherein the first banks are disposed on the insulating layer, and for each of the first banks, a portion of the organic bank layer included therein covers a portion of the insulating layer corresponding to gaps in the second direction between first electrodes that are adjacent to the first bank, and a remainder of the organic bank layer covers portions of the first electrodes that are adjacent to the first bank, and height from an upper surface of the insulating layer to an upper surface of the portion of the organic bank layer included therein is greater than height from the upper surface of the insulating layer to upper surfaces of the first electrodes.

Further, the organic light-emitting device pertaining to the present aspect may be configured to further comprise an insulating layer disposed between the substrate and the first electrodes, wherein the first banks are disposed on the insulating layer, for each of the first banks, a portion of the organic bank layer included therein covers a portion of the insulating layer corresponding to gaps between the first electrodes adjacent to the first bank in the second direction, and a remainder of the organic bank layer covers portions of the first electrodes adjacent to the first bank, the insulating layer has through-holes, into each one of which a portion of one of the first electrodes is recessed, and for each of the through holes, a portion of the remainder of the organic bank layer included in a corresponding one of the first banks is recessed therein.

Further, the organic light-emitting device pertaining to the present aspect may be configured so that, for each of the first banks, an upper surface of each portion recessed in the through-holes is flat.

Furthermore, the organic light-emitting device pertaining to the present aspect may be configured so that, for each of the through holes, a portion of the inorganic bank layer included in a corresponding one of the first banks is recessed therein, covering a respective part of the organic bank layer of the one of the first banks.

Furthermore, the organic light-emitting device pertaining to the present aspect may be configured so that depth of the portions of the inorganic bank layers recessed in the through holes is less than depth of the through holes.

Further, the organic light-emitting device pertaining to the present aspect may be configured so that affinity between the organic fluorine compound included in the second banks and the organic material included in the first banks is higher than affinity between the organic fluorine compound included in the second banks and material included in the first electrodes.

Further, the organic light-emitting device pertaining to the present aspect may be configured to further comprise hole injection layers disposed between the first electrodes and the organic functional layers, wherein affinity between the organic fluorine compound included in the second banks and the organic material included in the first banks is higher than affinity between the organic fluorine compound included in the second banks and material included in the hole injection layers.

Further, the organic light-emitting device pertaining to the present aspect may be configured so that, for each of the first banks, the organic bank layer included therein comprises: a central portion that is centrally positioned in the second direction and extends in the first direction; a first end portion that is adjacent to the central portion in the second direction and extends in the first direction; and a second end portion that is adjacent to the central portion in the second direction, the other side of the central portion to the first end portion, and extends in the first direction, and the inorganic bank layer included therein covers at least the first end portion and the second end portion.

The following describes an embodiment of the technology pertaining to the present disclosure, with reference to the drawings. Note that in the following drawings, the first direction is the X-axis direction and the second direction is the Y-axis direction.

EMBODIMENT

1. Schematic Configuration

Schematic configuration of an organic EL display device 1 comprising an organic light-emitting device 10 pertaining to the present embodiment is described with reference to FIG. 1. FIG. 1 is a schematic block diagram of the organic EL display device 1.

The organic EL display device 1 comprises the organic light-emitting device 10 and a control drive circuit 20 connected to the organic light-emitting device 10. The organic light-emitting device 10 is an organic EL display panel that utilizes electroluminescence of organic material. The control drive circuit 20 comprises four drive circuits and one control circuit.

2. Configuration of Organic Light-Emitting Device 10

<Layout of First Banks and Second Banks>

Figure 2:
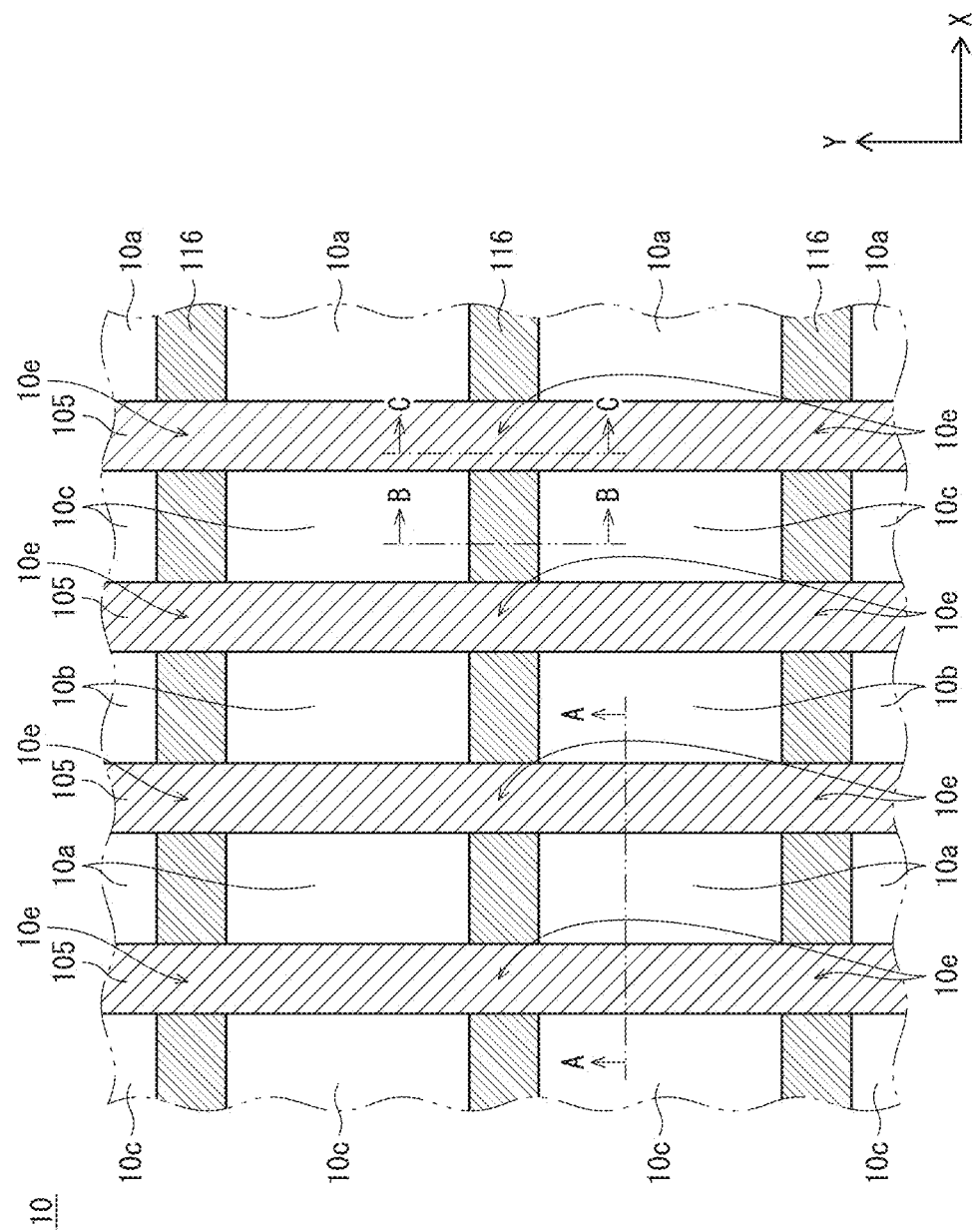
FIG. 2 is a layout diagram illustrating an arrangement of first banks and second banks with respect to sub-pixels of an organic light-emitting device.

First, layout of the first banks and the second banks in the organic light-emitting device is described with reference to FIG. 2. The drawing is a top plan view layout of the first banks and the second banks viewed from a direction perpendicular to the plane of the substrate. Here, as an example, an enlarged view is illustrated of six sub-pixels and a surrounding area of the organic light-emitting device 10.

The organic light-emitting device 10 comprises a plurality of sub-pixels 10a, 10b, 10c. The plurality of sub-pixels 10a, 10b, 10c are arranged in an X-axis direction and a Y-axis direction. One pixel comprises a set of three sub-pixels, sub-pixel 10a, sub-pixel 10b, and sub-pixel 10c, that are adjacent in the X-axis direction. The sub-pixel 10a emits red (R) light, the sub-pixel 10b emits green (G) light, and the sub-pixel 10c emits blue (B) light. The sub-pixels 10a, 10b, 10c each have a rectangular shape.

The organic light-emitting device 10 comprises first banks 116 and second banks 105. The first banks 116 extend in the X-axis direction and are parallel to each other. The second banks 105 extend in the Y-axis direction and are parallel to each other. The first banks 116 separate sub-pixels 10a, 10b, 10c that are adjacent in the Y-axis direction. The second banks 105 separate sub-pixels 10a, 10b, 10c that are adjacent in the X-axis direction. Intersection portions 10e of the second banks 105 are disposed on the first banks 116.

<Overall Configuration>

Figure 3:
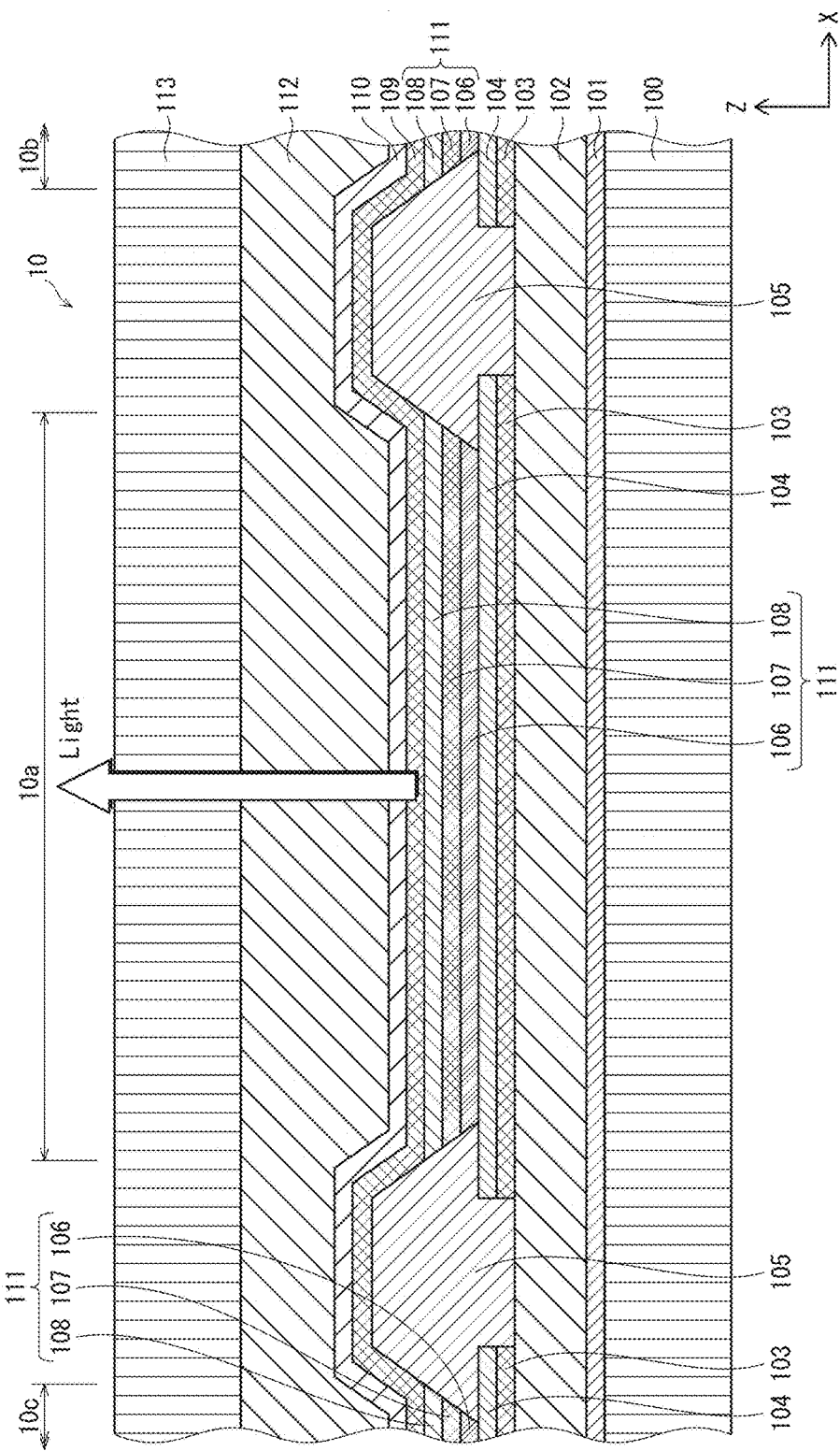
FIG. 3 is a schematic cross-sectional view illustrating a configuration of sub-pixels that are adjacent in an X-axis direction of FIG. 2.
Figure 4:
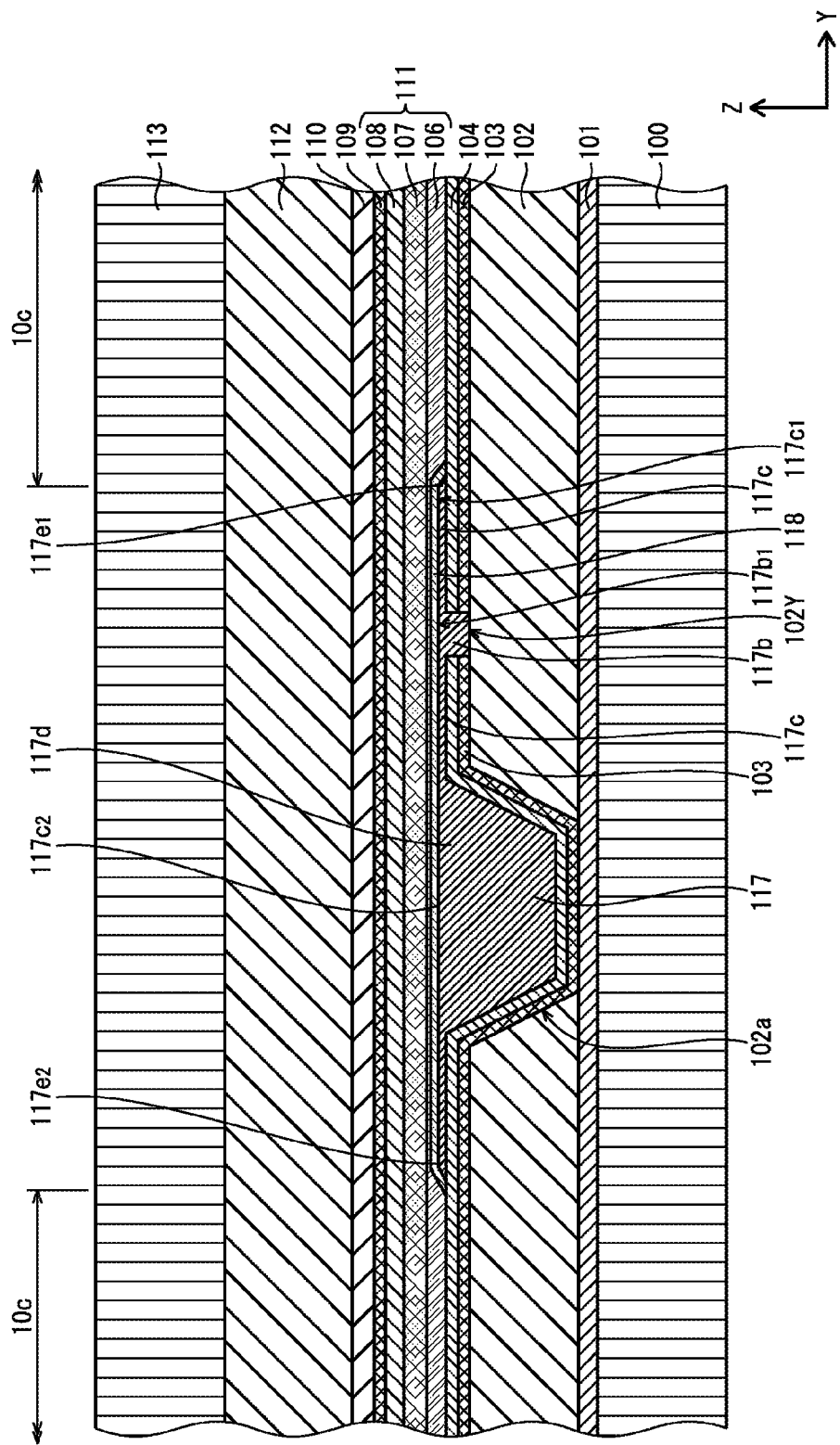
FIG. 4 is a schematic cross-sectional view illustrating a configuration of sub-pixels that are adjacent in a Y-axis direction of FIG. 2.
Figure 5:
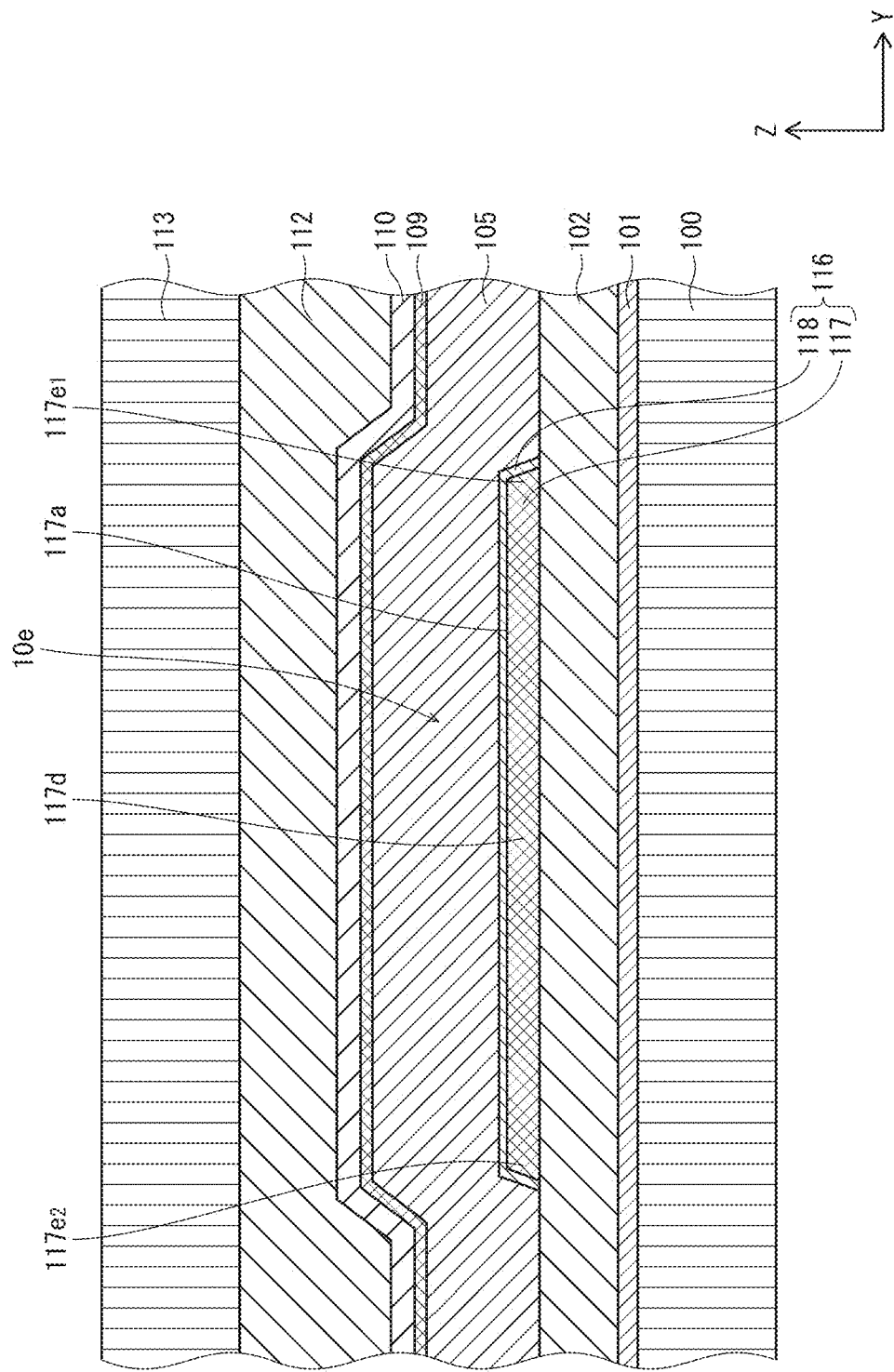
FIG. 5 is a schematic cross-sectional view illustrating an intersection of the first banks and the second banks of FIG. 2.

The following describes an overall configuration of the organic light-emitting device 10 with reference to the cross-sections in FIG. 3, FIG. 4, and FIG. 5. FIG. 3 is a cross-section A-A from FIG. 2, and illustrates configuration of sub-pixels 10a, 10b, 10c that are adjacent in the X-axis direction. FIG. 4 is a cross-section B-B from FIG. 2, and illustrates configuration of sub-pixels 10c that are adjacent in the Y-axis direction. FIG. 5 is a cross-section C-C from FIG. 2, and illustrates configuration of an intersection portion 10e where one of the second banks 105 and one of the first banks 116 intersect.

As illustrated in FIG. 3, the organic light-emitting device 10, in addition to the first banks 116 and the second banks 105, comprises: a substrate 100, a TFT layer 101, an insulating layer 102, first electrodes 103, hole injection layers 104, organic light-emitting layers 111, a second electrode 109, a sealing layer 110, a resin layer 112, and a substrate 113. The organic light-emitting device 10 is a top-emission-type display panel. Thus, light is emitted upwards in the Z-axis direction as indicated by the arrow in FIG. 3. The following describes each element of the organic light-emitting device 10 with reference to FIG. 3.

2. Elements of Organic Light-Emitting Device 10

<Substrate>

The substrate 100 is, for example, a glass substrate or a plastic substrate. As a material of the glass substrate, a material such as soda lime glass, alkali-free glass, etc., may be used. As a material of the plastic substrate, a material such as polyethylene, etc., may be used.

<TFT Layer>

The TFT layer 101 is disposed on the substrate 100. Further, although not illustrated, the TFT layer 101 comprises transistor elements associated one-to-one with the sub-pixels. Each of the transistor elements comprises three electrodes: a gate, a source, and a drain, a semiconductor layer, and a passivation layer.

<Insulating Layer>

The insulating layer 102 is disposed on the TFT layer 101. As a material of the insulating layer 102, a material such as polyimide, polyamide, acrylic resin, etc., may be used.

<First Electrodes>

As illustrated in FIG. 3, the first electrodes 103 are disposed on the insulation layer 102 at intervals in the X-axis direction. Further, as illustrated in FIG. 4, the first electrodes 103 are disposed on the insulation layer 102 at intervals in the Y-axis direction. The first electrodes 103 are disposed on the insulation layer 102 at intervals in the X-axis direction and at intervals in the Y-axis direction. The first electrodes 103 are electrically connected to the TFT layer 101 and function as anodes. As a material of the first electrodes 103, a metal material including silver (Ag) or aluminium (Al) may be used. The organic light-emitting device 10 is a top-emission-type, and therefore a surface of each of the first electrodes 103 preferably has a high reflectivity. Thickness of each of the first electrodes 103 is, for example, 400 nm.

<Hole Injection Layers>

The hole injection layers 104 are disposed on the first electrodes 103. The hole injection layers 104 have a function of improving hole injection from the first electrodes to the organic light-emitting layers 107. As a material of the hole injection layers 104, an inorganic material may be used, such as a metal oxide. As a metal oxide, an oxide of a metal such as silver (Ag), molybdenum (Mo), chromium (Cr), vanadium (V), tungsten (W), nickel (Ni), iridium (Ir), etc., may be used. Thickness of each of the hole injection layers 104 is, for example, from 5 nm to 20 nm.

<Organic Functional Layers>

The organic functional layers 111 are disposed on the hole injection layers 104. In the present embodiment, the organic functional layers 111 comprise hole transport layers 106, organic light-emitting layers 107, and electron transport layers 108.

The hole transport layers 106 are disposed on the hole injection layers 104. The hole transport layers 106 have a function of transporting holes injected from the first electrodes 103 to the organic light-emitting layers 107. A material of the hole transport layers 106 is an organic material. As the organic material of the hole transport layers 106, a polymer compound without a hydrophilic group may be used, such as polyfluorene, a derivative of polyfluorene, polyarylamine, a derivative of polyarylamine, etc.

The organic light-emitting layers 107 are disposed on the hole transport layers 106. The organic light-emitting layers 107 have a function of emitting light when an excited state is generated by recombination of holes and electrons injected thereto. Light emission color of the organic light-emitting layers 107 is different for the sub-pixels 10a, the sub-pixels 10b, and the sub-pixels 10c. For example, the light-emission color of the organic light-emitting layers 107 corresponding to the sub-pixels 10a is red, the light-emission color of the light-emitting layers 107 corresponding to the sub-pixels 10b is green, and the light-emission color of the light-emitting layers 107 corresponding to the sub-pixels 10c is blue. A material of the organic light-emitting layers 107 is a light-emitting organic material. As the light-emitting organic material of the organic light-emitting layers 107, a material such as an oxinoid compound, a perylene compound, a coumarin compound, an azacoumarin compound, etc., may be used.

The electron transport layers 108 are disposed on the organic light-emitting layers 107. The electron transport layers 108 have a function of transporting electrons injected from the second electrode 109 to the organic light-emitting layers 107. As a material of the electron transport layers 108, a material such as an oxydiazole derivative (OXD), a triazole derivative (TAZ), a phenanthroline derivative (BCP, Bphen), etc., may be used.

The organic functional layers 111 are disposed between adjacent ones of the second banks 105, as illustrated in FIG. 3, and extend in the Y-axis direction across the first banks 116, as illustrated in FIG. 4. The organic functional layers 111 corresponding to the sub-pixels 10c have the same thickness as each other. The hole transport layers 106 corresponding to the sub-pixels 10c have the same thickness as each other. Similarly, the organic light-emitting layers 107 corresponding to the sub-pixels 10c have the same thickness as each other and the electron transport layers 108 corresponding to the sub-pixels 10c have the same thickness as each other. Although not illustrated, the organic functional layers 111, the hole transport layers 106, the organic light-emitting layers 107, and the electron transport layers 108 that correspond to the sub-pixels 10a, 10b have thicknesses that are correlated in the same way.

For each of the sub-pixels 10a, 10b, 10c that has a different light-emission color, thickness of the organic functional layers 111 is set to a thickness appropriate for the light-emission color. Thus, although not illustrated, thickness of the organic functional layers 111 corresponding to the sub-pixels 10a may be different from thickness of the organic functional layers 111 corresponding to the sub-pixels 10b. Similarly, thickness of the organic light-emitting layers 107 corresponding to the sub-pixels 10a may be different from thickness of the organic light-emitting layers 107 corresponding to the sub-pixels 10b. Thickness of the electron transport layers 108 corresponding to the sub-pixels 10a may be different from thickness of the electron transport layers 108 corresponding to the sub-pixels 10b. Similarly, between the sub-pixels 10b and 10c and between the sub-pixels 10a and 10c, which have different light-emission colors, the organic functional layers 111, the hole transport layers 106, the organic light-emitting layers 107, and the electron transport layers 108 have thicknesses that are correlated in the same way.

<Second Electrode>

The second electrode 109 is disposed above the first banks 116 and on the electron transport layers 108. Further, as illustrated in FIG. 3, the second electrode 109 is disposed on the second banks 105 and on the electron transport layers 108. The second electrode 109 functions as a negative electrode. As a material of the second electrode 109, a material such as indium tin oxide (ITO) or indium zinc oxide (IZO) may be used. The organic light-emitting device 10 is a top-emission-type, and therefore the material of the second electrode 109 is preferably a light-transmitting material.

<Sealing Layer>

The sealing layer 110 is disposed on the second electrode 109. The sealing layer 110 has a function of preventing exposure of other layers to moisture and air. As a material of the sealing layer 110, a material such as silicon nitride (SiN) may be used.

<Resin Layer>

The resin layer 112 is disposed on the sealing layer 110. The resin layer 112 has a function of preventing exposure of other layers to moisture and air. As a material of the resin layer 112, a light-transmitting resin material such as an epoxy resin material may be used.

<Substrate>

The substrate 113 is disposed on the resin layer 112. The substrate 113, like the substrate 100, may be a glass substrate or a plastic substrate.

<Second Banks>

As illustrated in FIG. 3, aside from the intersection portions 10e where the second banks 105 intersect with the first banks 116, the second banks 105 are disposed in gaps in the X-axis direction between adjacent ones of the first electrodes 103. Specifically, the second banks 105 cover portions of the first electrodes 103, on which the hole injection layers 104 are formed, and cover an upper surface of the insulating layer 102 corresponding to gaps in the X-axis direction between adjacent ones of the first electrodes 103. As illustrated in FIG. 5, the intersection portions 10e, where the second banks 105 intersect with the first banks 116, are disposed on the first banks 116.

A material of the second banks 105 is a material including an organic fluorine compound, such as a fluorinated negative-type photoresist, for example a material including perfluorooctanoic acid (PFOA) ammonium salt. The material of the second banks 105 includes an organic fluorine compound and therefore, when forming the organic functional layers 111 by a printing method, the second banks 105 have an appropriate level of liquid repellency with respect to ink that is a material of the organic functional layers 111. Thickness of each of the second banks 105 is, for example, 1.0 µm.

<First Banks>

(Overall Configuration)

As described above, the first banks 116 separate sub-pixels that are adjacent in the Y-axis direction, as illustrated in FIG. 4. A portion of each of the first banks 116 is disposed in gaps in the Y-axis direction between adjacent ones of the first electrodes 103. Each of the first banks 116 includes an organic bank layer 117 and an inorganic bank layer 118 disposed on the organic bank layer 117. The organic bank layers 117 are disposed in gaps in the Y-axis direction between adjacent ones of the first electrodes 103. The organic bank layers 117 extend in the X-axis direction. Further, each of the organic bank layers 117 includes a central portion 117d that is centrally positioned in the Y-axis direction and extends in the X-axis direction, a first end portion 117e1 that is adjacent to the central portion in the Y-axis direction and extends in the X-axis direction, and a second end portion 117e2 that is adjacent to the central portion in the Y-axis direction, the other side of the central portion to the first end portion 117e1, and extends in the X-axis direction. In each of the organic bank layers 117, a portion of an upper surface of the first end portion 117e1 is an inclined surface and a portion of an upper surface of the second end portion 117e2 is an inclined surface. Each of the inorganic bank layers 118 entirely covers an upper surface 117a of a corresponding one of the organic bank layers 117, including the central portion 117d, the first end portion 117e1, and the second end portion 117e2. As illustrated in FIG. 5, each one of the intersection portions 10e of the second banks 105 is in direct contact with one of the first banks 116. Specifically, the second banks 105 are in direct contact with the inorganic bank layers 118.

As illustrated in FIG. 4, each of the organic bank layers 117 includes a portion 117b, which covers a portion of the insulating layer 102 (hereafter, "gap portion 102Y") that corresponds to a gap in the Y-axis direction between adjacent ones of the first electrodes 103. Further, each of the organic bank layers 117 includes a remainder 117c that covers a portion of corresponding ones of the first electrodes 103, on which the hole injection layers 104 are formed.

As a material of the organic bank layers 117, a material such as an acrylic resin positive-type photoresist may be used. As a material of the inorganic bank layers 118, a material such as silicon oxide (SiO), silicon nitride (SiN), silicon oxynitride (SiON), etc., may be used. Thickness of each of the inorganic bank layers 118 is, for example, from 1 nm to 500 nm. Thickness of each of the inorganic bank layers 118 refers to thickness of a central portion thereof.

(Configuration Around the Gap Portions of the Insulating Layer)

The following describes configuration around the gap portions 102Y of the insulating layer 102.

Suppose that the gap portions 102Y of the insulating layer 102 were covered by inorganic covering layers. For example, layers could be formed by chemical vapor deposition (CVD) of inorganic material. Thus, inorganic covering layers could be layered on the insulating layer 102 by CVD, for example. If inorganic covering layers were formed using CVD, upper surfaces of the inorganic covering layers would have shapes reflecting shapes of the layer(s) below the inorganic covering layers. In other words, the stepped shape formed by the insulating layer 102 and the first electrodes 103 would appear in the upper surfaces of the inorganic covering layers, and therefore steps would occur in the upper surfaces of the inorganic covering layers. In such a case, if the second electrodes were formed above the inorganic covering layers by sputtering, the second electrode could become broken at locations above the steps of the inorganic covering layers and thickness of the second electrode could become very thin at locations above the steps of the inorganic covering layers.

However, as illustrated in FIG. 4, consider that the gap portions 102Y of the insulating layer 102 are covered by the organic bank layers 117, which are composed of organic material. Because the material of the organic bank layers 117 is organic material, the organic bank layers 117 can be formed by a coating method. Because the organic material applied by a coating method is in a liquid state, the organic material immediately after application has fluidity. Thus, when the organic material is applied to a surface that has indentations, the organic material fills the indentations while an upper surface of the organic material becomes flat due to gravity. Subsequently, when the organic material is dried, an organic layer is formed that has a flat upper surface. In other words, upper surfaces of the organic bank layers 117 do not reflect shapes of the layer(s) below the organic bank layers 117. Thus, upper surfaces of the organic bank layers 117 can be flatted above stepped areas between the insulating layer 102 and the first electrodes 103. Specifically, for each of the organic bank layers 117, an upper surface 117b1 of the portion 117b and an upper surface 117c1 of a region of the remainder 117c near the portion 117b are flattened. Here, the inorganic bank layers 118 are composed of inorganic material, and can therefore be formed by CVD. In such a case, when the inorganic bank layers 118 are formed on the upper surfaces 117b1, 117c1 of the organic bank layers 117, upper surfaces of the inorganic bank layers 118 reflect the shape of the upper surfaces 117b1, 117c1 of the organic bank layers 117, which are flat, and are therefore flat. When upper surfaces are described as being flat, this means that height of an upper surface of a given layer is kept within an inclusive range from 95% to 105% of an average value of height of the given layer.

When the second electrode 109 is formed above the inorganic bank layers 118 by sputtering, upper surfaces of the inorganic bank layers 118 are flat, and therefore, at locations above the steps between the insulating layer 102 and the first electrodes 103, the second electrode 109 is prevented from becoming broken and thickness of the second electrode 109 is prevented from becoming very thin. In such a case, height from the upper surface 102b of the insulating layer 102 to the upper surfaces 117b1 of the portions 117b of the organic bank layers 117 is greater than height from the upper surface 102b of the insulating layer 102 to the upper surfaces 103a of the first electrodes 103. Note that height from the upper surface 102b of the insulating layer 102 to the upper surfaces 117b1 of the portions 117b of the organic bank layers 117 corresponds to thickness of each one of the portions 117b of the organic bank layers 117. Thickness of each one of the portions 117b of the organic bank layers 117 is 400 nm, for example.

(Configuration of Region Around Connection Points Between First Electrodes and TFT Layer)

The following describes configuration of regions around connection points between the first electrodes 103 and the TFT layer 101.

The insulating layer 102 has through holes 102a. As stated above, the first electrodes 103 are electrically connected to the TFT layer 101. Specifically, as illustrated in FIG. 4, between the sub-pixels 10*c* that are adjacent in the Y-axis direction, the first electrodes 103 are recessed into the through holes 102*a* in the insulating layer 102. Further, the portions of the first electrodes 103 that are recessed into the through holes 102*a* are connected to sources or drains of the TFT layer 101. Thus, electrical potential can be applied to the first electrodes 103. The through holes 102*a* that have this configuration are typically referred to as contact holes.

Portions of the remainder 117*c* of the organic bank layers 117 cover the portions of the first electrodes 103 that are recessed into the through holes 102*a*. In other words, portions of the remainder 117*c* of the organic bank layers 117 fill the through holes 102*a*. However, as described above, when organic material is applied to a surface that has indentations, the organic material fills the indentations while an upper surface of the organic material becomes flat due to gravity. Thus, when material of the organic bank layers 117 is applied in a liquid state by using a coating method, the material of the organic bank layers 117 fills the through holes 102*a* while upper surfaces of the material of the organic bank layers 117 becomes flat. Subsequently, when the material of the organic bank layers 117 is dried, the upper surfaces 117*c*2 of the portions of the organic bank layers 117 that fill the through holes 102*a* can be flattened. Further, portions of the inorganic bank layers 118 are disposed above the through holes 102*a*. Further, as described above, material of the inorganic bank layers 118 is inorganic material, and therefore the inorganic bank layers 118 can be formed by CVD. In such a case, when the inorganic bank layers 118 are formed above the through holes 102*a*, upper surfaces of the inorganic bank layers 118 reflect the shape of the upper surfaces 117*c*2 of the portions of the organic bank layers 117 that fill the through holes 102*a*, which are flat, and are therefore flat. As described above, the second electrode 109 can be formed by sputtering. In such a case, even when the second electrode 109 is formed above the inorganic bank layers 118 by sputtering, the second electrode 109 is prevented from becoming broken and thickness of the second electrode 109 is prevented from becoming very thin at locations above the through holes 102*a*.

Note that the first banks 116 fill the through holes 102*a* in a two-layer structure composed of the organic bank layers 117 and the inorganic bank layers 118. Thus, the risk of leakage current between the first electrodes 103 and the second electrode 109 is reduced. Further, the risk of contact between the TFT layer 101 and the first electrodes 103 becoming defective is reduced.

3. Manufacture of Organic Light-Emitting Device 10

Figure 6:
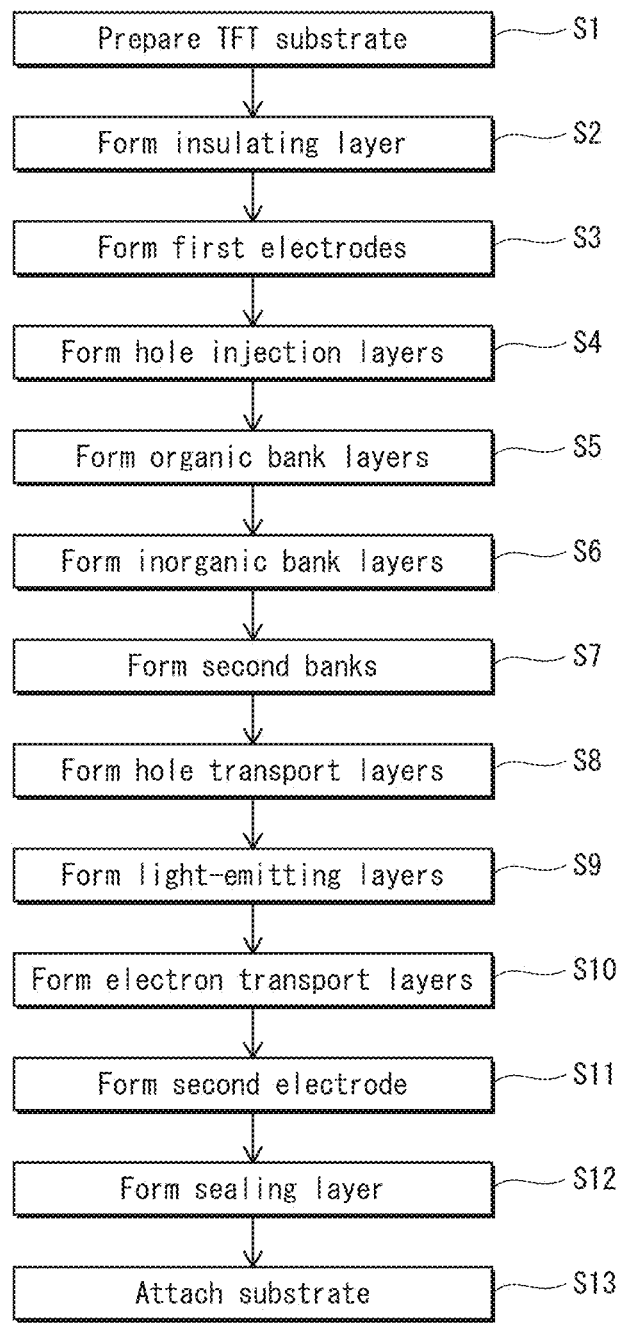
FIG. 6 is a flowchart illustrating a process of manufacturing the organic light-emitting device.

The following describes an overview of a process of manufacturing the organic light-emitting device 10 with reference to the flowchart of FIG. 6.

First, a TFT substrate is prepared (step S1). The TFT substrate is the TFT layer 101 formed on the substrate 100, and is manufactured by known techniques.

The insulating layer 102 is formed on the TFT substrate (step S2). Specifically, an organic material layer is formed on the TFT substrate by a coating method. Further, the insulating layer 102 is formed by formation of the through holes 10*a*.

The first electrodes 103 and the hole injection layers 104 are formed, in order, on the insulating layer (steps S3 and S4). Specifically, first, a metal layer is formed on the insulating layer by sputtering or vacuum deposition. Subsequently, the first electrodes 103 are formed by patterning of the metal layer into units corresponding to the sub-pixels 10*a*, 10*b*, 10*c*. Further, a metal oxide layer is formed on the first electrodes 103 by sputtering. Subsequently, the hole injection layers 104 are formed by patterning of the metal layer into units corresponding to the sub-pixels 10*a*, 10*b*, 10*c*.

Subsequently, the organic bank layers 117 are formed (step S5). Specifically, the organic bank layers 117 are formed by using photolithography. In other words, material (for example, photosensitive acrylic resin) of the organic bank layers 117 is applied in a liquid state by using a coating method such as spin coating, to form a resin layer. Further, the resin layer is patterned by light exposure and developing, and the organic bank layers 117 are formed by baking. Specifically, UV irradiation processing for approximately 200 s is performed as the light exposure. In the developing, the resin layer that has not been hardened is eliminated by developer. The baking is performed at a temperature from 150° C. to 230° C. for approximately 20 mins.

The inorganic bank layers 118 are formed on the organic bank layers 117 (step S6). Specifically, the inorganic bank layers 118 are formed by forming a silicon nitride layer by using CVD, then patterning the silicon nitride layer. According to steps S5 and S6, the first banks 116 are completed.

Further, the second banks 105 are formed (step S7). Specifically, the second banks 105 are formed by using photolithography. In other words, material (for example, an organic fluorine compound) of the second banks 105 is applied in a liquid state by spin coating over all of the insulating layer 102, on which the first electrodes 103, the hole injection layers 104, and the first banks 116 are formed, to form a resin layer. Subsequently, as in step S5, the resin layer is patterned by light exposure and developing, and the second banks 105 are formed by baking. Specifically, UV irradiation processing for approximately 200 s is performed as the light exposure. In the developing, the resin layer that has not been hardened is eliminated by developer. The baking is performed at a temperature from 150° C. to 230° C. for approximately 20 mins.

Subsequently, the hole transport layers 106 are formed in application regions, which are region separated by the second banks 105 (step S8). Specifically, material of the hole transport layers 106 is applied to the application regions in an ink state, by a printing method. Subsequently, the hole transport layers 106 are formed by drying the ink. Note that applied ink does not mix in sub-pixels that are adjacent in the X-axis direction, because the thickness of the second banks 105 is high and the second banks 105 include an organic fluorine compound that has liquid repellency. Thus, properties of the hole transport layers 106 can be made different in sub-pixels that are adjacent in the X-axis direction and have different light-emission colors. Here, "properties of the hole transport layers" means materials and thicknesses of the hole transport layers.

However, thicknesses of portions of the first banks 116 that separate ink are less than thicknesses of portions of the second banks 105 that separate ink. Further, material of the first banks 116 does not include fluorine atoms, and does not have liquid repellency. Thus, when material of the hole transport layers 106 is applied to regions between adjacent ones of the first banks 116 in the X-axis direction and on the first banks 116 themselves, the ink, which has fluidity, is continuous in the Y-axis direction. As a result, volume of ink applied to a sub-pixel and volume of ink applied to sub-pixels that are adjacent to the sub-pixel in the Y-axis direction are equalized. However, when ink is continuous in the Y-axis direction, an upper surface of the ink is substantially flat because of gravity. Subsequently, when the ink is dried, thickness of a given one of the hole transport layers 106 is the same for sub-pixels that are adjacent in the Y-axis direction.

Further, the organic light-emitting layers 107 and the electron transport layers 108 are formed in this order in the application regions (steps S9 and S10). As in step S8, each material is applied in an ink state and dried to form the organic light-emitting layers 107 and the electron transport layers 108, respectively. For both the organic light-emitting layers 107 and the electron transport layers 108, applied ink does not mix between sub-pixels that are adjacent to each other in the X-axis direction. Thus, properties of the organic light-emitting layers 107 and the electron transport layers 108 can each be made different in sub-pixels that are adjacent in the X-axis direction and have different light-emission colors. For both the organic light-emitting layers 107 and the electron transport layers 108, material thereof can be applied in an ink state in regions between the first banks 116 that are adjacent in the Y-axis direction and on the first banks 116 themselves. As a result, as with the hole transport layers 106, between sub-pixels that are adjacent in the Y-axis direction, thickness of a given one of the organic light-emitting layers 107 is the same and thickness of a given one of the electron transport layers 108 is the same. Thus, properties of a given one of the organic light-emitting layers 107 can be made the same and properties of a given one of the electron transport layers 108 can be made the same in sub-pixels that are adjacent in the Y-axis direction and have the same light-emission colors.

The second electrode 109 and the sealing layer 110 are formed in this order, covering an upper surface of the hole transport layers 108 and the second banks 105 (steps S11 and S12). Specifically, the second electrode 109 and the sealing layer 110 are formed by sputtering.

Subsequently, the organic light-emitting device 10 is completed by attaching the substrate 113 to the sealing layer 110 (step S13).

4. Consideration of Function of Inorganic Bank Layer

Function of the inorganic bank layers 118 is described with reference to FIGS. 7A to 10C. First, an organic light-emitting device 999 pertaining to a comparative example is described. Between the organic light-emitting device 999 pertaining to the comparative example and the organic light-emitting device 10 pertaining to the present embodiment, only the configuration of the first banks is different, specifically the presence/absence of the inorganic bank layers 118, and other configuration is the same.

<Organic Light-Emitting Device 999>

Figure 7A:
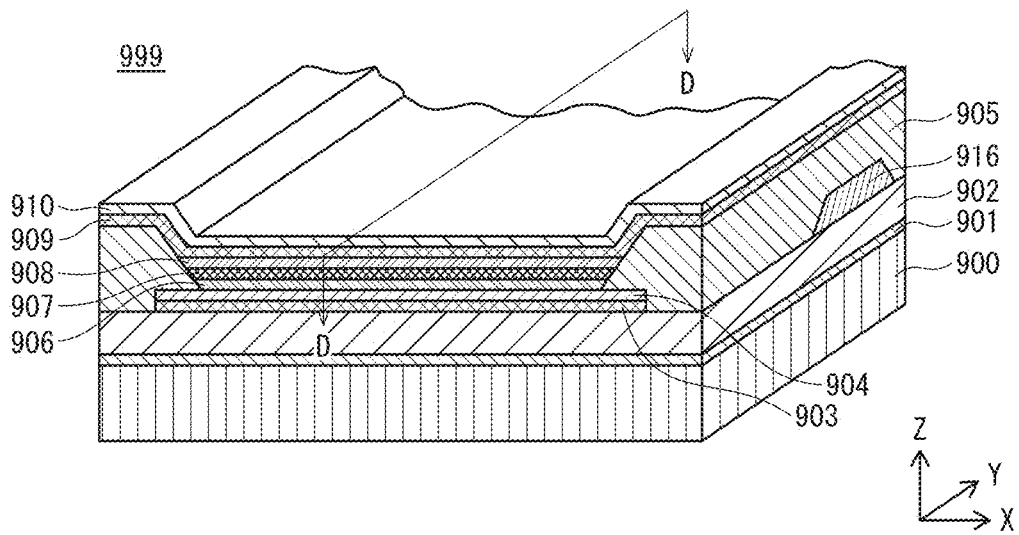
FIG. 7A, FIG. 7B, and FIG. 7C are for describing an organic light-emitting device pertaining to a comparative example.

FIG. 7A is a partially cut-away perspective view of the organic light-emitting device 999 pertaining to the comparative example. Note that an uppermost layer of the organic light-emitting device (the substrate 113 of the organic light-emitting device 10) is not illustrated. FIGS. 7B, 7C, 8A, 8B, and 8C are cross-sections taken from D-D of FIG. 7A, and illustrate steps S5 to S8.

As illustrated in FIG. 7A, according to the organic light-emitting device 999, the first banks 916 are in contact with the second banks 905. Further, each of the first banks 916 is formed by only an organic bank layer. The following describes a process from forming the first banks 916 to forming the hole transport layers (steps S5 to S8).

Figure 7B:
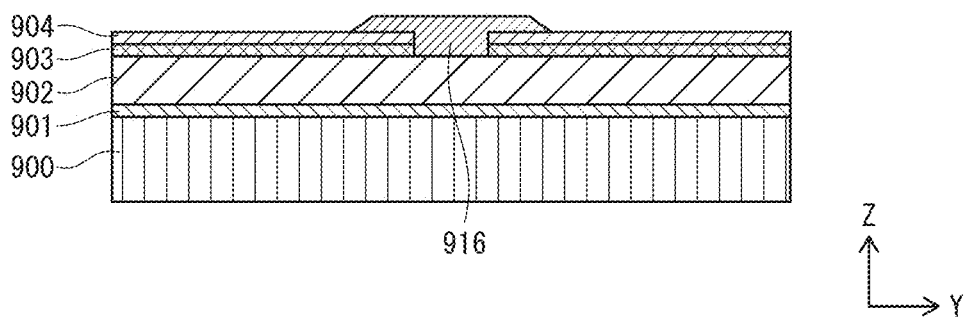
Figure 7C:
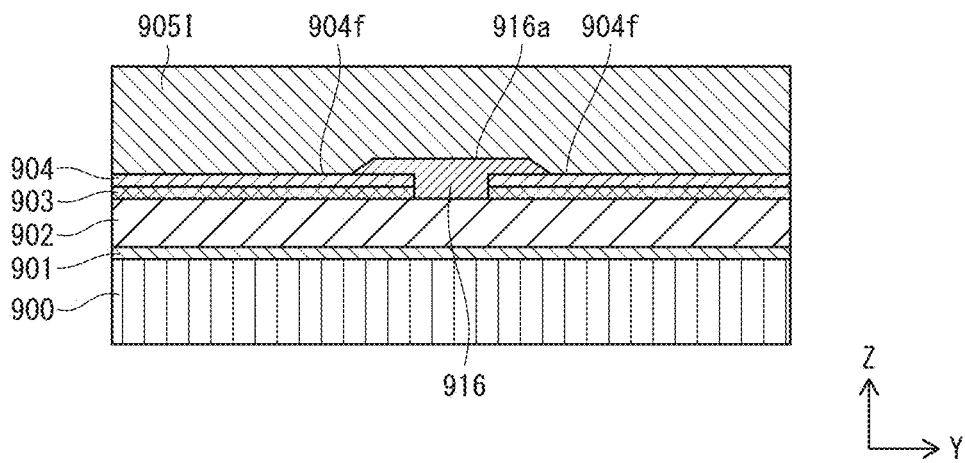

First, as illustrated in FIG. 7B, the first banks 916 are formed. Further, as illustrated in FIG. 7C, second bank material 905I is applied over the insulating layer 902 on which the hole injection layers 904 and the first banks 916 are formed. Subsequently, light exposure, developing, and baking is performed with respect to the second bank material 905I. The developing has the aim of washing away a portion of the second bank material that is not hardened by light exposure.

However, "steps" exist from end portions 904f of the hole injection layers 904 near adjacent ones of the first banks 916 to the adjacent ones of the first banks 916. Typically, when a liquid flows to the "steps" between the end portions 904f and the first banks 916 on the hole injection layers 904, structurally speaking, the liquid easily accumulates and flows with difficulty at the "steps". Thus, when developing is performed, developer containing the second bank material 905I may have difficulty flowing from the "steps" between the end portions 904f and the first banks 916 on the hole injection layers 904. As a result, developer containing the second bank material 905I may adhere to and remain at the "steps" between the end portions 904f and the first banks 916 on the hole injection layers 904. Affinity is high between the organic fluorine compound included in the second bank material 905I and the organic material included in the first banks 916. Here, "affinity is high between the organic fluorine compound included in the second bank material 905I and the organic material included in the first banks 916" means that intermolecular attraction is high between the organic fluorine compound included in the second bank material 905I and the organic material included in the first banks 916. Thus, electrons may be shared, and covalent bonding may occur between the organic fluorine compound of the second bank material 905I contained in the developer and the organic material included in the first banks 916. Thus, when developing, the possibility is high of developer containing the second bank material 905I adhering to and remaining at the "steps" between the end portions 904f and the first banks 916 on the hole injection layers 904.

Figure 8A:
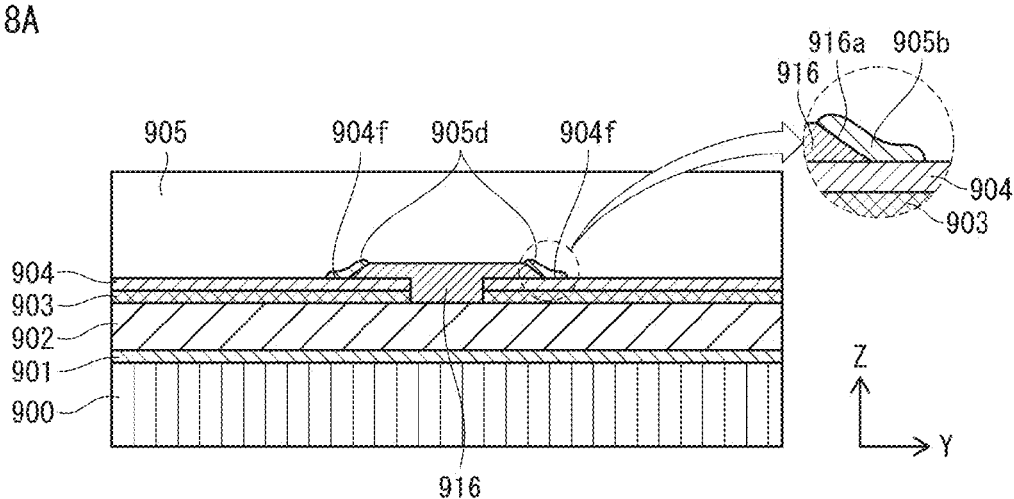
FIG. 8A, FIG. 8B, and FIG. 8C are for describing the organic light-emitting device pertaining to the comparative example.
Figure 8B:
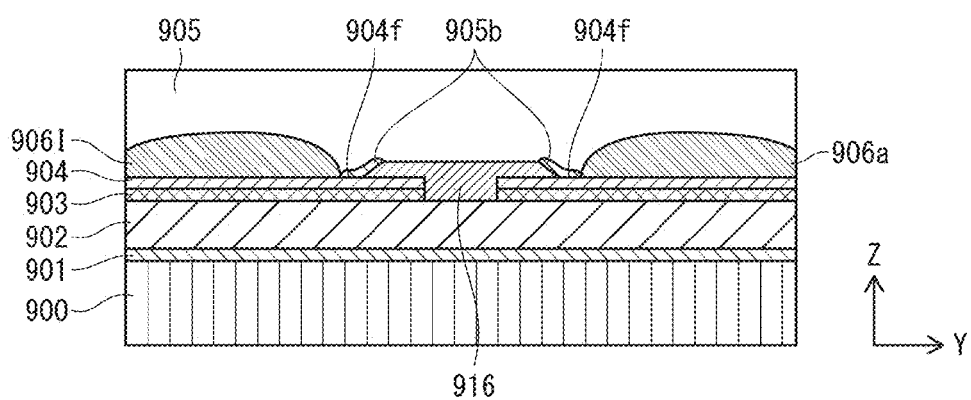
Figure 8C:
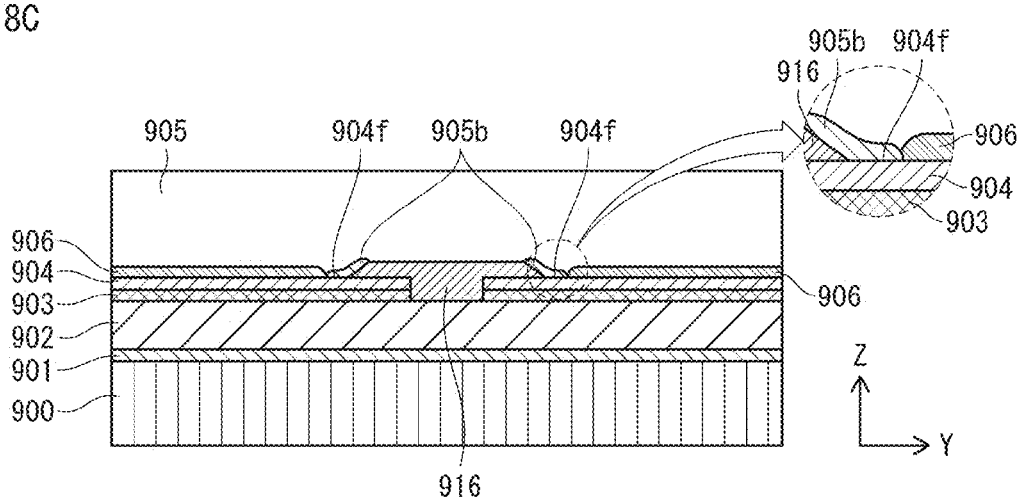

When developer containing the second bank material 905I remains, residue 905b of the second banks 905 remains after baking, as illustrated in FIG. 8A. The residue 905b of the second banks 905 occurs at the end portions 904f on the hole injection layers 904.

Figure 11A:
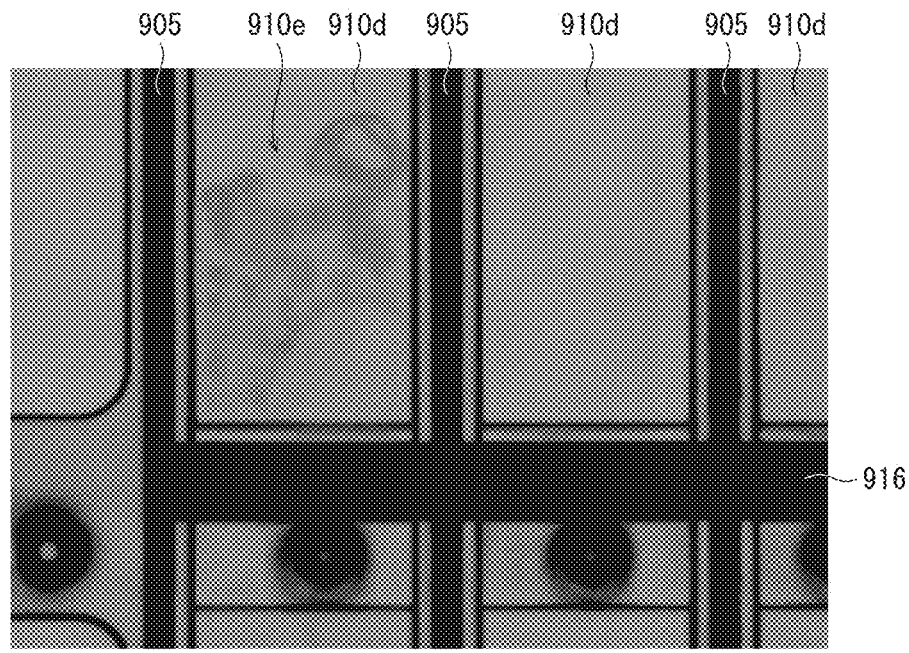
FIG. 11A is a photograph illustrating a defective formation of an organic functional layer in an organic light-emitting device pertaining to a comparative example.
Figure 11B:
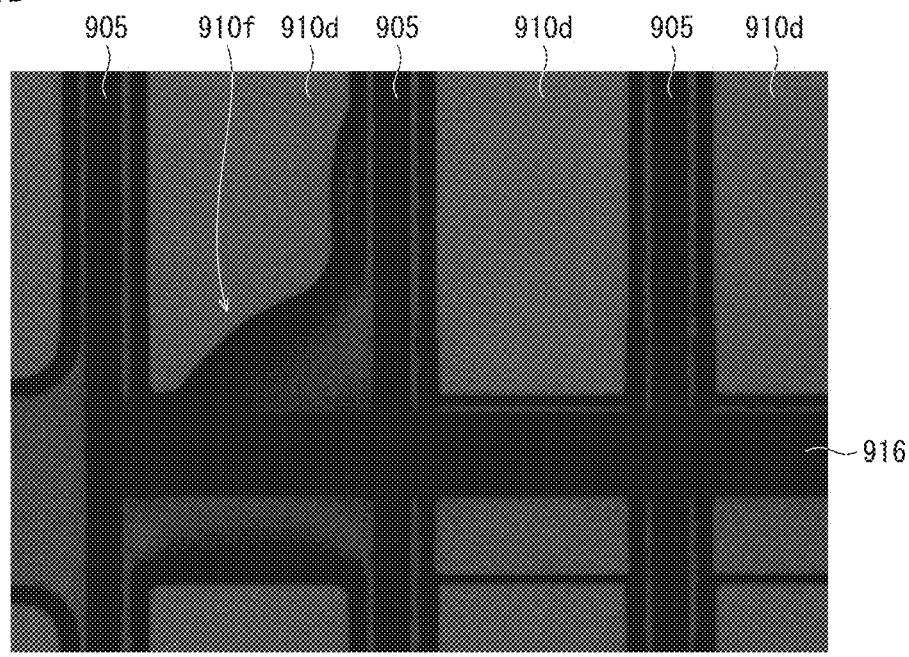
FIG. 11B is a photograph illustrating a defective formation of an organic functional layer in an organic light-emitting device pertaining to a comparative example in which a material of the second banks is different from a material of the second banks used in the comparative example of FIG. 11A.

During forming of the hole transport layers 906, it is necessary to form the hole transport layers 906 across all of each region defined by the second banks 916 on the hole injection layers 904, in order to cause all of each sub-pixel to emit light. Assume that an attempt is made to apply hole transport layer material 9061 to all of each region defined by the second banks 916 on the hole injection layers 904. When such an attempt is made, the residue 905b is present at the end portions 904f of the hole transport layer 904, and therefore the hole transport layer material 9061 cannot cover the end portions 904f This is because the second banks 905 include the organic fluorine compound, and therefore the residue 905b of the second banks 905 has liquid repellency. Subsequently, when the hole transport layer material 9061 is dried, the hole transport layers 906 are not formed on the end portions 904f, which are near the first banks 916, and are only formed on the remaining regions of the hole injection layers 904. Thus, defective formation of the hole transport layers 906 occurs. In such a case, in each sub-pixel, uneven light emission occurs, because light emission does not occur in regions near the first banks 916 and light emission does occur in other regions. Images captured in plan view when actually manufacturing the organic light-emitting device 999 are illustrated in FIGS. 11A and 11B. In the images, in sub-pixels 910d that are each defined by adjacent ones of the first banks 916 and adjacent ones of the second banks 905, defective formation regions 910e, 910f of the organic functional layers are apparent. Note that the organic light-emitting device 999 illustrated in FIG. 11A and FIG. 11B each has the same configuration as the organic light-emitting device 10, except for the material of the second banks.

<Organic Light-Emitting Device 10>

The following considers the organic light-emitting device 10. As illustrated in the partially cut-away image of FIG. 9A, the organic light-emitting device 10 comprises the inorganic bank layers 118 between the second banks 105 and the organic bank layers 117. Note that the substrate 113, which is the uppermost layer, is not illustrated. FIGS. 9B, 9C, 10A, 10B, and 10C are cross-sections taken from E-E of FIG. 9A, and illustrate steps S5 to S8.

Figure 9A:
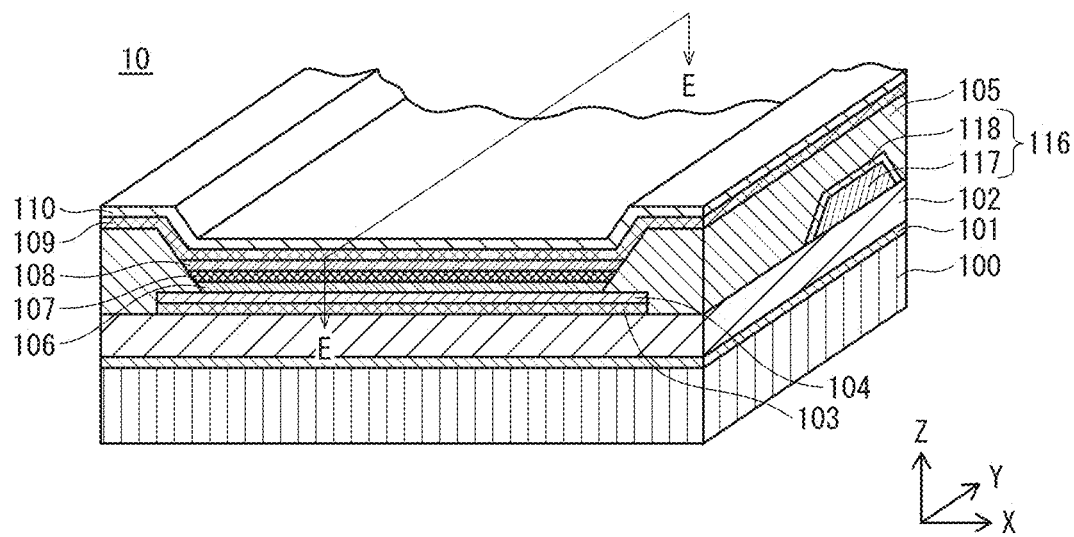
FIG. 9A, FIG. 9B, and FIG. 9C are for describing the organic light-emitting device.

As illustrated in FIG. 9A, according to the organic light-emitting device 10, the first banks 116 are in contact with the second banks 105. Further, the first banks 116 include the organic bank layers 117 and the inorganic bank layers 118 disposed on the organic bank layers 117. Further, an uppermost surface of each of the first banks 116 is an uppermost surface of a corresponding one of the inorganic bank layers 118. The following describes a process from forming the first banks 116 to forming the hole transport layers 106 (steps S5 to S8).

Figure 9B:
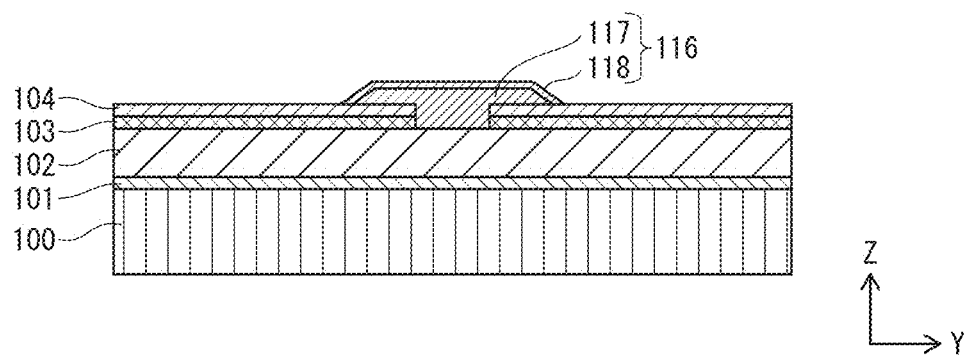
Figure 9C:
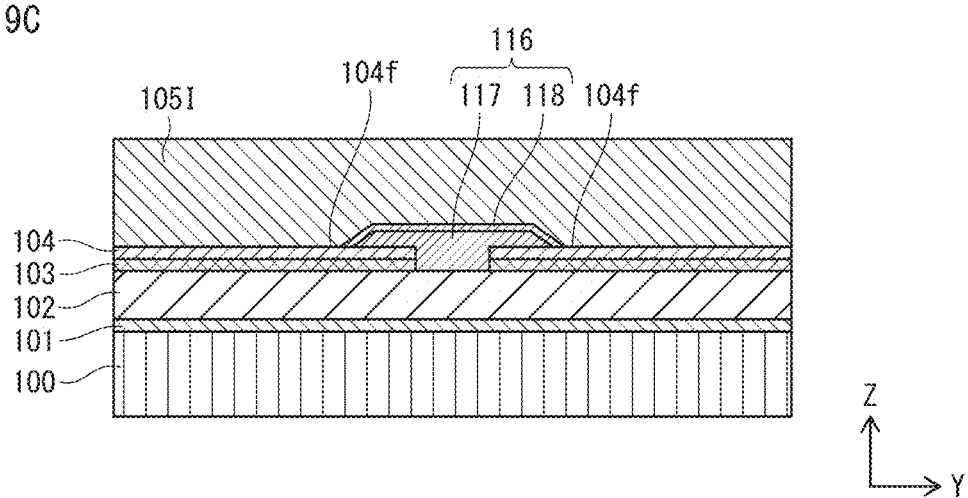
Figure 10A:
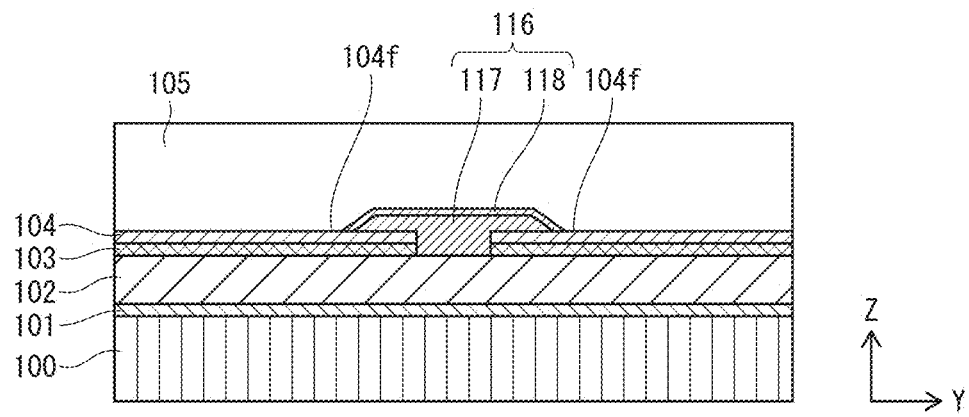
FIG. 10A, FIG. 10B, and FIG. 10C are for describing the organic light-emitting device.
Figure 10B:
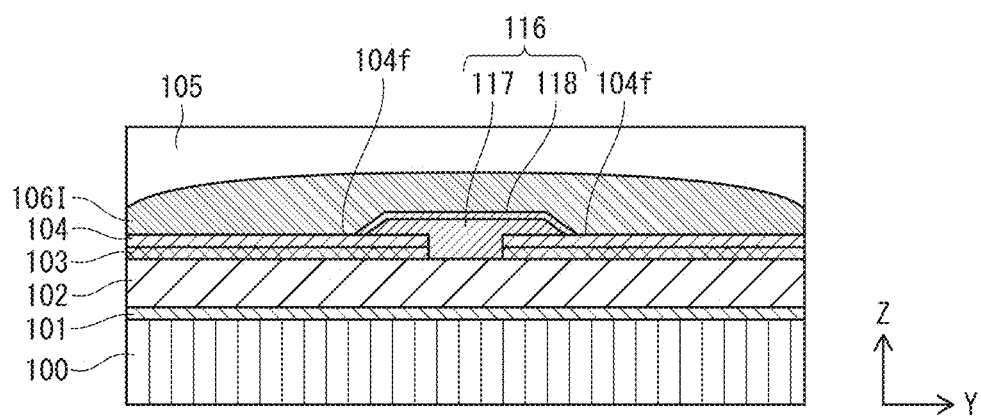
Figure 10C:
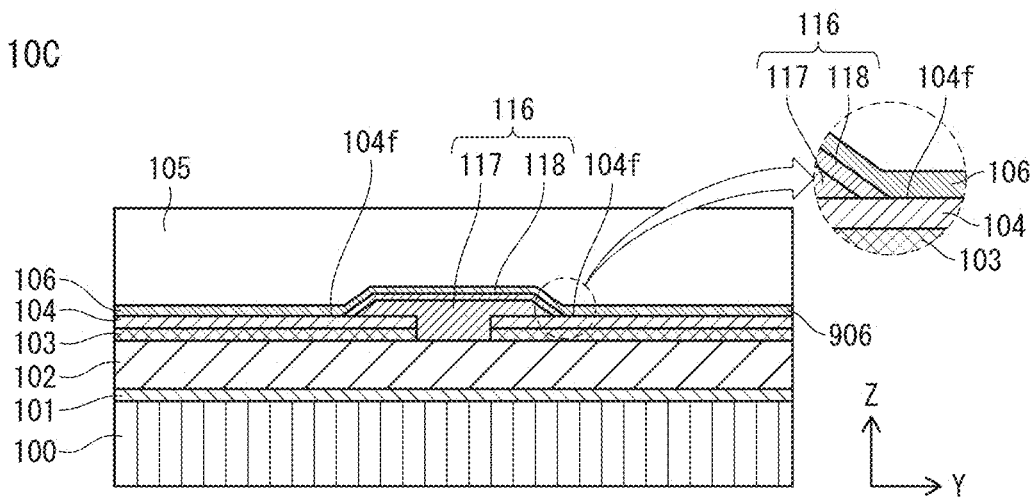

As illustrated in FIG. 9B, the first banks 116 are formed. Upper surfaces of the organic bank layers 117 are covered by the inorganic bank layers 118. Further, as illustrated in FIG. 9C, material 1051 of the second banks 105 is applied over the insulating layer 102 on which the hole injection layers 104 and the first banks 116 are formed. The inorganic bank layers 118 cover the upper surfaces of the organic bank layers 117, and therefore the organic fluorine compound that is material of the second banks 105 and the organic material included in the organic bank layers 117 do not contact each other. However, "steps" exist from end portions 104f of the hole injection layers 104 near adjacent ones of the first banks 116 to the adjacent ones of the first banks 116. Thus, when a liquid flows to the "steps" between the end portions 104f and the first banks 116 on the hole injection layers 104, structurally speaking, the liquid easily accumulates and flows with difficulty at the "steps". Here, the inorganic bank layers 118 of the first banks 116 create the "steps" at the end portions 104f of the hole injection layers 104. Affinity is low between the organic fluorine compound that is a material of the second banks 105 and the inorganic material that is a material of the inorganic bank layers 118. Thus, when developing, the possibility is low of developer containing the material 1051 of the second banks 105 adhering to and remaining at the "steps" between the end portions 104f and the first banks 116 on the hole injection layers 104. Accordingly, as illustrated in FIG. 10A, residue of the second banks 105 does not remain on the inorganic bank layers 118. Thus, as illustrated in FIG. 10B, hole transport layer material 1061 can cover an entire region above the hole injection layers 104. As a result, as illustrated in FIG. 10C, a given one of the hole transport layers 106 can be formed over the entire region. Accordingly, defective formation of the hole transport layers 106 can be prevented. In other words, according to the organic light-emitting device 10, defective formation of the organic functional layers 111 can be prevented. Thus, light-emission unevenness in the sub-pixels can be prevented.

<<Modifications>>

1. First Banks

In the embodiment above, the inorganic bank layers are formed to completely cover the organic bank layers. However, the inorganic bank layers may be formed to cover portions of each of the organic bank layers. For example, the inorganic bank layers may be formed to cover at least a first end portion and a second end portion of each of the organic bank layers.

Figure 12:
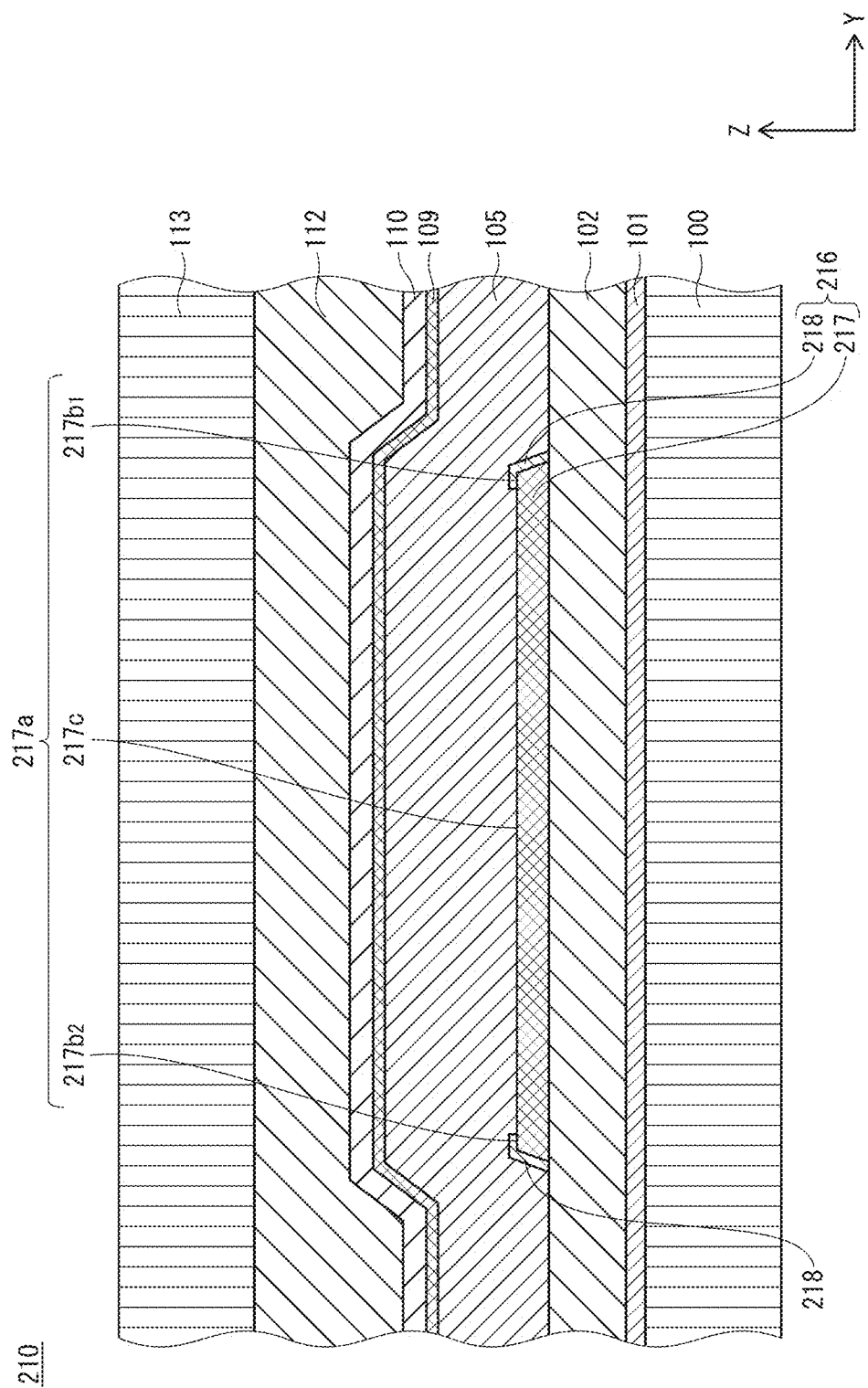
FIG. 12 is a schematic cross-section illustrating a modification of the organic light-emitting device.

The cross-section of FIG. 12 illustrates an organic light-emitting device 210 pertaining to a modification. Organic bank layers 217 are disposed in gaps in the Y-axis direction between adjacent ones of the first electrodes 103. The organic bank layers 217 extend in the X-axis direction. Further, each of the organic bank layers 217 comprises: a central portion 217c that is centrally positioned in the Y-axis direction and extends in the X-axis direction; a first end portion 217b1 that is adjacent to the central portion 217c in the Y-axis direction and extends in the X-axis direction; and a second end portion 217b2 that is adjacent to the central portion 217c in the Y-axis direction, the other side of the central portion 217c to the first end portion 217b1, and extends in the X-axis direction.

In manufacturing of the organic light-emitting device 210, after formation of the second banks 105, the central portion 217c of the upper surface 217a of each of the organic bank layers 217 is not covered by inorganic material. On the other hand, the first end portion 217b1 and the second end portion 217b2 of the upper surface of each of the organic bank layers 217 is covered by the inorganic bank layers 218. Thus, the inorganic bank layers 218 of the first banks 216 create the "steps" at the end portions near the first banks 205 on the hole injection layers. Thus, residue of the second banks 105 does not remain at the "steps" between the end portions of the hole injection layers and the inorganic bank layers 218. Accordingly, defective formation of the organic functional layers 111 can be prevented. Further, according to the embodiment above, organic bank layers fill through holes in the insulating layer, and an upper surface of the organic bank layers filling the through holes is flat. However, cases in which the upper surface of the organic bank layers is not flat may be considered. For example, in a step of forming the organic bank layers by using a coating method, when viscosity of material of the organic bank layers in a liquid state is high, the upper surface of the organic bank layers may be recessed and not flat. Further, during a step of forming the organic bank layers by using a coating method, even when viscosity of material of the organic bank layers in a liquid state is low, the upper surface of the organic bank layers may become recessed due to baking after application of the material and light exposure. In this configuration, thickness of the material of the organic bank layers prior to baking is thicker at portions filling the through holes and thinner at other portions. Thus, when shrinkage of the material of the organic bank layers in baking is uniform, the amount of shrinkage of thickness of the material of the organic bank layers during baking is greater in the portions filling the through holes and less in other portions. As a result, the portions of the organic bank layers filling the through holes may become concave. Even when the upper surfaces of the organic bank layers become concave in this way, effects of the technology pertaining to the present disclosure can be achieved by suppressing concavity of upper surfaces of portions of the inorganic bank layers recessed in the through holes. The following describes this modification.

Figure 13:
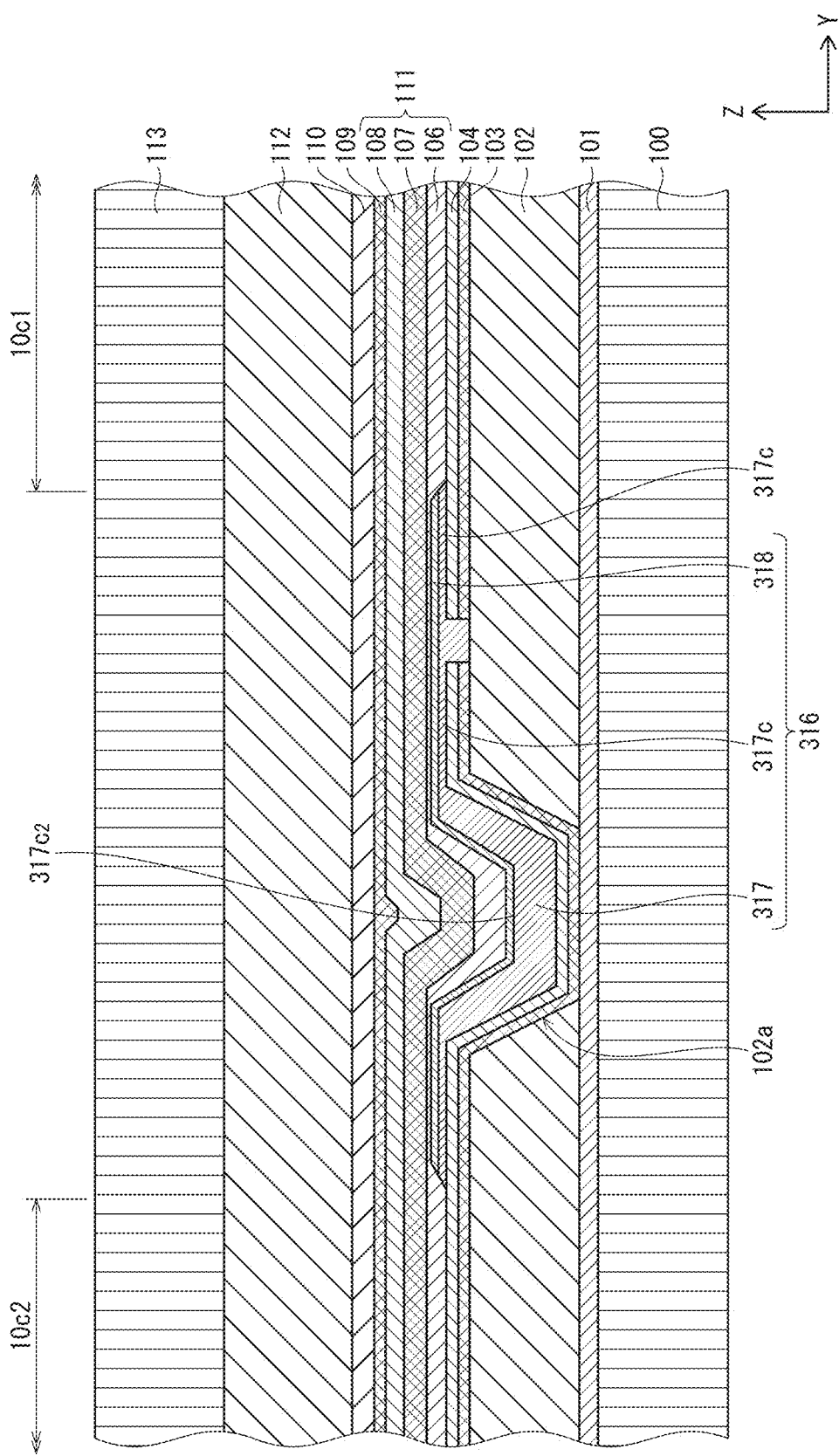
FIG. 13 is a schematic cross-section illustrating a modification of the organic light-emitting device.

As illustrated in the cross-section of FIG. 13, upper surfaces 317c2 of portions recessed into the through holes 102a of portions 317c of the organic bank layers 317 are concave. In this case, depth of the portions of the inorganic bank layers 318 recessed into the through holes 102a is less than total depth of the through holes by the amount of the portion of the organic bank layers recessed into the through holes 102a. Thus, a high degree of concavity of the upper surfaces of portions of the inorganic bank layers 318 recessed into the through holes 102a can be suppressed. Thus, even when the second electrode 109 is formed above the inorganic bank layers 318 by sputtering, the second electrode 109 is prevented from becoming broken and thickness of the second electrode 109 is prevented from becoming very thin at locations above the through holes 102a.

Further, according to the embodiment above, material of the organic bank layers of the first banks is an acrylic resin positive-type photoresist, but may alternatively be an organic material such as polyimide resin, silicone resin, phenolic resin, etc.

2. Second Banks

According to the embodiment above, material of the second banks is a fluorinated negative-type photoresist. However, material of the second banks may simply be an organic material. In such a case, after light exposure and developing of the organic material, in order to provide surfaces of the second banks with liquid repellency, the surfaces of the second banks may be plasma treated with fluorine gas through a mask with openings only over regions in which the second banks are formed, and the mask subsequently removed.

3. Overall Configuration

According to the embodiment above, a top-emission type of display panel is used as an example, but the same effects can be achieved even when the technology of the present disclosure is applied to a bottom-emission type of display panel.

Further, according to the embodiment above, one pixel comprises a combination of three sub-pixels that each have a rectangular shape in plan view, but other configurations are possible. For example, shape of the sub-pixels in plan view may be that of a triangle, hexagon, octagon, etc., having an overall honeycomb appearance. The number of sub-pixels for one pixel may be four, and may be a greater number than four. In such a case, the sub-pixels for a pixel may all emit different color light from each other, or a portion of the sub-pixels may emit the same color light as each other.

4. Configuration of Each Element

According to the embodiment above, when a plastic substrate is used as the substrate, materials other than polyethylene may be used. For example, the plastic substrate may be a layered substrate in which one or more of following is used in one or more layers: a polyolefin such as polypropylene, ethylene-propylene copolymer, ethylene-vinyl acetate copolymer (EVA), etc., cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, acryl-styrene copolymer (AS resin), butadiene-styrene copolymer, ethylene vinyl alcohol (EVOH) copolymer, polyethelene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, another fluorine-based resin, various thermoplastic elastomers such as styrene-based, polyolefin-based, polyvinyl chloride-based, polyurethane-based, fluororubber-based, or chlorinated polyethylene-based thermoplastic elastomers, epoxy resin, phenolic resin, urea resin, melamine resin, unsaturated polyester, silicone resin, poly- urethane, etc., or a copolymer, blend, polymer alloy, etc., that primarily comprises one of the above.

According to the embodiment above, the first electrodes are each single-layer structures made of a metallic material. However, alternatively, a layered body comprising a metal layer and a light-transmissive electrically-conductive layer may be used. As a material of the light-transmissive electrically-conductive layer, indium tin oxide (ITO) or indium zinc oxide (IZO) may be used.

Further, according to the embodiment above, the organic functional layers comprise hole transport layers, organic light-emitting layers, and electron transport layers. However, for example, the organic functional layers may consist of electron block layers and buffer layers in addition to hole transport layers and light-emitting layers. Further, the organic functional layers may consist of only organic light-emitting layers. In such a case, defective formation of the organic light-emitting layers can be prevented because residue of the second banks does not occur on the inorganic bank layers.

Further, according to the embodiment above, between the second banks, the organic functional layers are each formed to be continuous in a direction across the first banks. However, the organic functional layers may be divided by the first banks and continuous across the first banks. In such a case, at least during a process of manufacturing the organic functional layers, as long as ink that is a material of a functional layer and applied to a given sub-pixel can enter sub-pixels that are adjacent over the first banks, volume of ink applied to each sub-pixel can be equalized across adjacent sub-pixels. Subsequently, even when the ink reduces due to drying and the organic functional layers are formed without a portion across the upper surfaces of the first banks, thickness of the organic functional layers is uniform among sub-pixels that are adjacent and have the same light emission color.

According to the embodiment above, hole injection layers are disposed on the first electrodes, but the organic light-emitting layers may be disposed on the first electrodes directly. In a case in which hole injection layers are not provided, as long as affinity between the organic fluorine compound that is material of the second banks and the organic material that is material of the second banks is higher than affinity between the organic fluorine compound that material of the second banks and material of the first electrodes, the effects of the technology of the present disclosure are achieved.

In addition to the configuration illustrated in the embodiment above, a black matrix layer and/or color filter layer may be provided from the second electrode in a direction of light emission. The black matrix layer may be provided to prevent mixing of colors between sub-pixels that emit different colors of light. Material of the black matrix layer may be, for example, an ultraviolet curing resin material that includes black pigment having excellent light absorption and light-shielding properties. As the ultraviolet curing resin material, for example, acrylic resin may be used. The color filter layer has a function of selectively transmitting visible light of red (R), green (G), and blue (B) wavelengths. As material of the color filter layer, for example, material based on acrylic resin may be used. By providing the black matrix layer and the color filter layer, the organic light-emitting device can be implemented having further improved color purity.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the technology pertaining to the present disclosure, they should be construed as being included therein.

The invention claimed is:

1. An organic light-emitting device comprising:
a substrate;
first electrodes disposed above the substrate at intervals in a first direction and intervals in a second direction, the first direction being parallel to a surface of the substrate and the second direction being parallel to the surface of the substrate and perpendicular to the first direction;
an insulating layer disposed between the substrate and the first electrodes;
first banks disposed above the substrate on the insulating layer between adjacent ones of the first electrodes in the second direction, the first banks each extending in the first direction;
second banks disposed above the substrate between adjacent ones of the first electrodes in the first direction, the second banks each extending in the second direction, having portions intersecting with and disposed above the first banks, and including an organic fluorine compound;
organic functional layers disposed above the first electrodes between the second banks, each of the organic functional layers comprising an organic light-emitting layer; and
a second electrode disposed above the organic functional layers, wherein
each of the first banks comprises an organic bank layer including an organic material and an inorganic bank layer disposed on the organic bank layer,
for each of the first banks, an uppermost surface thereof is a surface of the inorganic bank layer included therein, and
for each of the first banks, a portion of the organic bank layer included therein covers a portion of the insulating layer corresponding to gaps in the second direction between first electrodes that are adjacent to the first bank, and a remainder of the organic bank layer covers portions of the first electrodes that are adjacent to the first bank, and a height from an upper surface of the insulating layer to an upper surface of the portion of the organic bank layer included therein is greater than a height from the upper surface of the insulating layer to upper surfaces of the first electrodes.

2. The organic light-emitting device of claim 1, wherein included in the inorganic bank layer is an inorganic material selected from the group consisting of silicon nitride, silicon oxide, and silicon oxynitride.

3. The organic light-emitting device of claim 1, wherein thickness of the inorganic bank layer is from 1 nm to 500 nm.

4. The organic light-emitting device of claim 1, wherein
the insulating layer includes through-holes,
for each of the through-holes, a portion of one of the first electrodes is recessed therein, and
for each of the through-holes, a portion of the remainder of the organic bank layer included in a corresponding one of the first banks is recessed therein.

5. The organic light-emitting device of claim 4, wherein for each of the first banks, an upper surface of each portion recessed in the through-holes is flat.

6. The organic light-emitting device of claim 1, wherein affinity between the organic fluorine compound included in the second banks and the organic material included in the first banks is higher than affinity between the organic fluorine compound included in the second banks and material included in the first electrodes.

7. The organic light-emitting device of claim 1, further comprising:
hole injection layers disposed between the first electrodes and the organic functional layers, wherein
affinity between the organic fluorine compound included in the second banks and the organic material included in the first banks is higher than affinity between the organic fluorine compound included in the second banks and material included in the hole injection layers.

8. The organic light-emitting device of claim 1, wherein for each of the first banks,
the organic bank layer included therein comprises: a central portion that is centrally positioned in the second direction and extends in the first direction; a first end portion that is adjacent to the central portion in the second direction and extends in the first direction; and a second end portion that is adjacent to the central portion in the second direction, the other side of the central portion to the first end portion, and extends in the first direction, and
the inorganic bank layer included therein covers at least the first end portion and the second end portion.

9. The organic light-emitting device of claim 1, wherein the first banks and the second banks are perpendicular in a top plan view.

10. The organic light-emitting device of claim 9, wherein the first banks and the second banks define a grid in the top plan view.

11. The organic light-emitting device of claim 1, wherein the inorganic bank layer entirely covers the organic bank layer in a top plan view of the first banks and the second banks viewed from a direction perpendicular to a plane of the substrate.

12. The organic light-emitting device of claim 1, wherein the inorganic bank layer entirely covers an upper surface of the organic bank layer.

13. The organic light-emitting device of claim 1, wherein a width of the inorganic bank layer in the second direction is wider than a width of the organic bank layer in the second direction.

14. The organic light-emitting device of claim 1, wherein the organic bank layer is disposed in gaps between the adjacent ones of the first electrodes in the second direction.

15. The organic light-emitting device of claim 1, wherein the second banks are in direct contact with the inorganic bank layer.

16. An organic light-emitting device, comprising:
a substrate;
first electrodes disposed above the substrate at intervals in a first direction and intervals in a second direction, the first direction being parallel to a surface of the substrate and the second direction being parallel to the surface of the substrate and perpendicular to the first direction;
an insulating layer disposed between the substrate and the first electrodes;
first banks disposed above the substrate on the insulating layer between adjacent ones of the first electrodes in the second direction, the first banks each extending in the first direction;

second banks disposed above the substrate between adjacent ones of the first electrodes in the first direction, the second banks each extending in the second direction, having portions intersecting with and disposed above the first banks, and including an organic fluorine compound;

organic functional layers disposed above the first electrodes between the second banks, each of the organic functional layers comprising an organic light-emitting layer; and a second electrode disposed above the organic functional layers, wherein each of the first banks comprises an organic bank layer including an organic material and an inorganic bank layer disposed on the organic bank layer, for each of the first banks, an uppermost surface thereof is a surface of the inorganic bank layer included therein, for each of the first banks, a portion of the organic bank layer included therein covers a portion of the insulating layer corresponding to gaps between the first electrodes adjacent to the first bank in the second direction, and a remainder of the organic bank layer covers portions of the first electrodes adjacent to the first bank, the insulating layer includes through-holes, for each of the through-holes, a portion of one of the first electrodes is recessed therein, for each of the through-holes, a portion of the remainder of the organic bank layer included in a corresponding one of the first banks is recessed therein, and for each of the through-holes, a portion of the inorganic bank layer included in a corresponding one of the first banks is recessed therein, covering a respective part of the organic bank layer of the one of the first banks.

17. An organic light-emitting device, comprising:
a substrate;
first electrodes disposed above the substrate at intervals in a first direction and intervals in a second direction, the first direction being parallel to a surface of the substrate and the second direction being parallel to the surface of the substrate and perpendicular to the first direction;
an insulating layer disposed between the substrate and the first electrodes;

first banks disposed above the substrate on the insulating layer between adjacent ones of the first electrodes in the second direction, the first banks each extending in the first direction;

second banks disposed above the substrate between adjacent ones of the first electrodes in the first direction, the second banks each extending in the second direction, having portions intersecting with and disposed above the first banks, and including an organic fluorine compound;

organic functional layers disposed above the first electrodes between the second banks, each of the organic functional layers comprising an organic light-emitting layer; and a second electrode disposed above the organic functional layers, wherein each of the first banks comprises an organic bank layer including an organic material and an inorganic bank layer disposed on the organic bank layer, for each of the first banks, an uppermost surface thereof is a surface of the inorganic bank layer included therein, for each of the first banks, a portion of the organic bank layer included therein covers a portion of the insulating layer corresponding to gaps between the first electrodes adjacent to the first bank in the second direction, and a remainder of the organic bank layer covers portions of the first electrodes adjacent to the first bank, the insulating layer includes through-holes, for each of the through-holes, a portion of one of the first electrodes is recessed therein, for each of the through-holes, a portion of the remainder of the organic bank layer included in a corresponding one of the first banks is recessed therein, for each of the through-holes, a portion of the inorganic bank layer included in a corresponding one of the first banks is recessed therein, covering a respective part of the organic bank layer of the one of the first banks, and a depth of the portion of the inorganic bank layer recessed in each of the through-holes is less than a depth of each of the through-holes.

* * * * *